(12) United States Patent
Yamada et al.

(10) Patent No.: US 12,117,634 B2
(45) Date of Patent: Oct. 15, 2024

(54) FLEXIBLE DISPLAY DEVICE, METHOD FOR MANUFACTURING FLEXIBLE DISPLAY DEVICE, AND FOLDABLE DISPLAY DEVICE

(71) Applicant: SHARP KABUSHIKI KAISHA, Sakai (JP)

(72) Inventors: Miho Yamada, Sakai (JP); Masahiro Hasegawa, Sakai (JP); Akira Sakai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 563 days.

(21) Appl. No.: 17/603,244

(22) PCT Filed: Apr. 16, 2019

(86) PCT No.: PCT/JP2019/016372
§ 371 (c)(1),
(2) Date: Oct. 12, 2021

(87) PCT Pub. No.: WO2020/213069
PCT Pub. Date: Oct. 22, 2020

(65) Prior Publication Data
US 2022/0179144 A1 Jun. 9, 2022

(51) Int. Cl.
G02B 5/30 (2006.01)
G02B 1/118 (2015.01)
G02B 1/18 (2015.01)
H01L 27/15 (2006.01)
H10K 59/40 (2023.01)
(Continued)

(52) U.S. Cl.
CPC ............ *G02B 5/3016* (2013.01); *G02B 1/118* (2013.01); *G02B 1/18* (2015.01); *H01L 27/156* (2013.01); *H10K 59/40* (2023.02); *H10K 59/50* (2023.02); *H10K 77/111* (2023.02)

(58) Field of Classification Search
CPC ........ G02B 5/3016; G02B 1/118; G02B 1/18; H01L 27/156; H01L 25/167; H10K 59/40; H10K 59/50; H10K 77/111; H10K 59/879; H10K 59/8791; H10K 71/80; H10K 2102/311; Y02E 10/549; G09F 9/00;
(Continued)

(56) References Cited

U.S. PATENT DOCUMENTS

2011/0194052 A1* 8/2011 Hiratsuka ............ G02B 5/3033
349/194
2014/0319490 A1* 10/2014 Kim ........................ G02B 1/14
359/507
(Continued)

FOREIGN PATENT DOCUMENTS

JP 2007-241267 A 9/2007
JP 2008-179702 A 8/2008
(Continued)

*Primary Examiner* — Mariam Qureshi
(74) *Attorney, Agent, or Firm* — ScienBiziP, P.C.

(57) ABSTRACT

In a flexible display device, a transistor layer, a light-emitting element layer, a sealing layer, a first flexible substrate, a λ/4 layer, a linear polarizer, an overcoat layer, and a water repellent layer are provided in this order on a second flexible substrate, and the water repellent layer is provided so as to overlap with at least an end portion of the overcoat layer.

20 Claims, 25 Drawing Sheets

(51) Int. Cl.
*H10K 59/50* (2023.01)
*H10K 77/10* (2023.01)

(58) Field of Classification Search
CPC ........... G09F 9/30; H05B 33/02; H05B 33/04; H05B 33/06; H05B 33/10; H05B 33/14
See application file for complete search history.

(56) References Cited

U.S. PATENT DOCUMENTS

2018/0097199 A1* 4/2018 Jo ........................ H10K 59/873
2021/0107252 A1* 4/2021 Kawamitsu ............... B32B 7/06

FOREIGN PATENT DOCUMENTS

| JP | 2011-257489 A | 12/2011 |
| JP | 2014-206681 A | 10/2014 |
| JP | 2014-206682 A | 10/2014 |

* cited by examiner

| SAMPLE | WATER CONTACT ANGLE | TEST RESULTS 45° VISUAL EVALUATION (TINGE CHANGE) | TEST RESULTS 90° VISUAL EVALUATION (TINGE CHANGE) | TEST RESULTS WIPE CUT SURFACE WITH CLOTH (COMMON TO 45 AND 90°) |
|---|---|---|---|---|
| SAMPLE 1 (COMMERCIALLY AVAILABLE WATER REPELLENT COATING AGENT) | 103° | NO INVASION OF WATER | NO INVASION OF WATER | NO ATTACHMENT OF INK TO CLOTH |
| SAMPLE 2 (SUPER WATER REPELLENT MOTH-EYE) | > 150° | NO INVASION OF WATER | NO INVASION OF WATER | NO ATTACHMENT OF INK TO CLOTH |
| SAMPLE 3 (SUPER WATER REPELLENT MOTH-EYE ON EDGE) | > 150° | NO INVASION OF WATER | NO INVASION OF WATER | NO ATTACHMENT OF INK TO CLOTH |
| SAMPLE 4 (OVERCOAT ONLY) | 56° | INVASION OF WATER FROM CUT SURFACE AFTER 1 MINUTE | INVASION OF WATER FROM CUT SURFACE AFTER 1 MINUTE | INK ADHERES TO CLOTH |
| SAMPLE 5 (PET) | 61° | WATER INVADES FROM CUT SURFACE AFTER 1 MINUTE | WATER INVADES FROM CUT SURFACE AFTER 2 MINUTES | INK ADHERES TO CLOTH |
| SAMPLE 6 (WATER REPELLENT COAT DIRECTLY ON POLARIZER) | - | | | - |
| SAMPLE 7 (COATING TYPE POLARIZER WITHOUT OVERCOAT) | - | POLARIZED INK DISSOLVES IN WATER AT THE SAME TIME AS WATER CONTACT | POLARIZED INK DISSOLVES IN WATER AT THE SAME TIME AS WATER CONTACT | INK ADHERES TO CLOTH |

FIG. 24

FLEXIBLE DISPLAY DEVICE, METHOD FOR MANUFACTURING FLEXIBLE DISPLAY DEVICE, AND FOLDABLE DISPLAY DEVICE

TECHNICAL FIELD

The disclosure relates to a flexible display device, a method for manufacturing a flexible display device, and a foldable display device.

BACKGROUND ART

In recent years, various display devices including a light-emitting element have been developed. Particularly, a display device including an Organic Light Emitting Diode (OLED) and a display device including an inorganic light-emitting diode or a Quantum dot Light Emitting Diode (QLED) have drawn a great deal of attention because these devices offer advantages such as lower power consumption, smaller thickness, and higher picture quality.

Furthermore, in the field of such display devices, there is a demand for a flexible display device, which is a display device being bendable, or a foldable display device, which is a display device being foldable. In order to realize a flexible display device or a foldable display device, development of a thin polarizer is required. A method for applying and drying a solution including a dichroic pigment such as lyotropic liquid crystal (LCLC) is known as a method for manufacturing a thin polarizer, but most of target materials are water-soluble and instantly dissolve at the moment when they come into contact with water. Therefore, there is a demand for a technique of protecting the coated polarizer from a hydrophilic material such as water even after it is provided in a display device in a post process or as a finished product.

PTL 1 to PTL 3 describe providing an overcoat material to protect a coating surface of a solution including a dichroic pigment such as a lyotropic liquid crystal. PTL 4 and PTL 5 describe insolubilizing a film formed by applying and drying a solution including a dichroic pigment such as a lyotropic liquid crystal.

CITATION LIST

Patent Literature

PTL 1: JP 2014-206682 A (published on Oct. 30, 2014)
PTL 2: JP 2014-206681 A (published on Oct. 30, 2014)
PTL 3: JP 2008-179702 A (published on Aug. 7, 2008)
PTL 4: JP 2007-241267 A (published on Sep. 20, 2007)
PTL 5: JP 2011-257489 A (published on Dec. 22, 2011)

SUMMARY

Technical Problem

However, in the case of the above-mentioned technique of providing the overcoat material, there are problems as described below.

(a) of FIG. 25 is a diagram illustrating a schematic configuration of a known display device 100 including a display element substrate 101, a polarization layer 102 including a lyotropic liquid crystal, and an overcoat material 103 for protecting the polarization layer 102 including the lyotropic liquid crystal from a hydrophilic material 104 such as water.

(b) of FIG. 25 is a diagram illustrating a schematic configuration of a known display device 110 including a display element substrate 101, a polarization layer 102 including a lyotropic liquid crystal, and an overcoat material 105 for protecting the polarization layer 102 including the lyotropic liquid crystal from a hydrophilic material such as water.

The display device 100 illustrated in (a) of FIG. 25 is obtained by a partitioning step in which a display element assembly substrate (not illustrated) including a plurality of display devices 100 is singulated into individual display devices 100. This partitioning step exposes the cut surfaces of each of the plurality of display devices 100, and thus there is a problem that the hydrophilic material 104 such as water invades from the cut surfaces. It is also conceivable that the invasion of the hydrophilic material 104 such as water from the cut surfaces occurs not only during the manufacturing process such as the partitioning step, but also in a case where a hydrophilic material 104 such as water attached to the surface of the display device 100 as a finished product flows from the opening or the joint of the housing or the like. In particular, liquid pools of the hydrophilic material 104 such as water is likely to occur at the edge of the surface of the display device 100, that is, at the edge of the overcoat material 103, and thus there is also concern that droplets of the hydrophilic material 104 such as water are continuously supplied from the edge of the overcoat material 103 to the cut surfaces of the polarization layer 102 including a lyotropic liquid crystal for a long period of time.

In order to prevent the invasion of the hydrophilic material 104 such as water from the cut surfaces, it is contemplated that the overcoat material 105 covering the end face of the polarization layer 102 including the lyotropic liquid crystal is also provided on the cut surfaces as in the display device 110 illustrated in (b) of FIG. 25. However, in order to provide the overcoat material 105 also on the cut surfaces, it is necessary to separately add a step of providing the overcoat material 105 on the cut surfaces after the partitioning step. The step of providing the overcoat material 105 on the cut surfaces has a problem of poor productivity. If the overcoat material 105 is provided on the cut surface of the display device 110, the terminal portion that needs to be exposed is covered by the overcoat material 105, for example, in mounting a touch panel or the like, and thus productivity is further diminished.

In the case of the above-mentioned technique of performing the insolubilization treatment, since the insolubilization treatment is performed at a low temperature, there is a problem that it is not easy to introduce production equipment in consideration of the cost.

The disclosure has been made in view of the above problems, and an object thereof is to provide a flexible display device, a method for manufacturing a flexible display device, and a foldable display device with high productivity and that can suppress invasion of hydrophilic materials such as water into a linear polarizer including a lyotropic liquid crystal.

Solution to Problem

The inventors have found that the invasion of a hydrophilic material such as water from an end face of a display device is mainly due to the fact that the hydrophilic material tends to remain at the end face of the display device, and revealed that, by adopting the following configurations and manufacturing methods in which the hydrophilic material does not remain on the end face of the display device, it is possible to greatly suppress invasion of a hydrophilic material such as water from the end face of the display device.

In order to solve the problems described above, a flexible display device according to the disclosure is a flexible display device including a transistor layer, a light-emitting element layer, and a sealing layer, the flexible display device further including:
- a first flexible substrate;
- a second flexible substrate;
- a phase difference plate;
- a linear polarizer including a lyotropic liquid crystal;
- an overcoat layer; and
- a water repellent layer,
- wherein the transistor layer, the light-emitting element layer, the sealing layer, the first flexible substrate, the phase difference plate, the linear polarizer, the overcoat layer, and the water repellent layer are provided in this order on the second flexible substrate, and
- the water repellent layer is provided to overlap with at least an end portion of the overcoat layer.

In order to solve the problems described above, a foldable display device according to the disclosure includes:
- the flexible display device;
- a first non-flexible support substrate supporting a first display region that is part of the display region of the flexible display device; and
- a second non-flexible support substrate supporting a second display region that is another part of the display region of the flexible display device,
- wherein a third display region that is still another part of the display region of the flexible display device is between the first display region and the second display region, and overlaps with a gap between the first non-flexible support substrate and the second non-flexible support substrate, and
- the flexible display device is bent in the third display region.

In order to solve the problems described above, a method for manufacturing a flexible display device according to the disclosure includes:
- forming a non-flexible display element substrate including forming a resin layer on a non-flexible first support substrate, forming a barrier layer on the resin layer, forming a transistor layer on the barrier layer, forming a light-emitting element layer on the transistor layer, and forming a sealing layer on the light-emitting element layer;
- forming a circular polarizer including forming a first flexible substrate on a non-flexible second support substrate, forming a linear polarizer including a lyotropic liquid crystal on the first flexible substrate, forming an overcoat layer on the linear polarizer, forming a water repellent layer on the overcoat layer, and peeling off the non-flexible second support substrate from the first flexible substrate; and
- forming a flexible display element provided with a circular polarizer including attaching the circular polarizer to the sealing layer of the non-flexible display element substrate via an adhesive layer and peeling off the non-flexible first support substrate from the resin layer of the non-flexible display element substrate.

Advantageous Effects of Disclosure

A flexible display device, a method for manufacturing a flexible display device, and a foldable display device can be provided with high productivity and are capable of suppressing invasion of a hydrophilic material such as water into a linear polarizer including a lyotropic liquid crystal.

BRIEF DESCRIPTION OF DRAWINGS

FIG. 24 is a diagram illustrating test results for samples 1 to 7 in which the degree of invasion of water into a linear polarizer including a lyotropic liquid crystal was checked.

DESCRIPTION OF EMBODIMENTS

Figure 1:
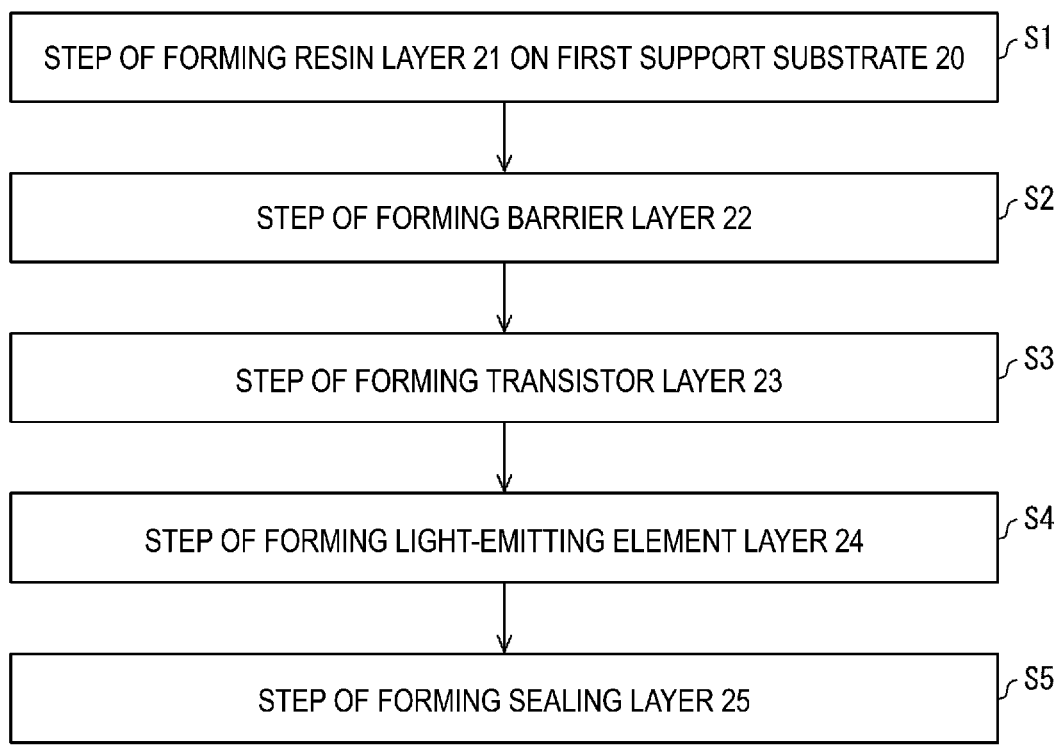
FIG. 1 is a diagram explaining a step of forming a non-flexible display element substrate.

A description follows regarding embodiments of the disclosure, with reference to FIGS. 1 to 24. Hereinafter, for convenience of description, components having the same functions as those described in a specific embodiment are denoted by the same reference numerals, and descriptions thereof may be omitted.

First Embodiment

Figure 2:
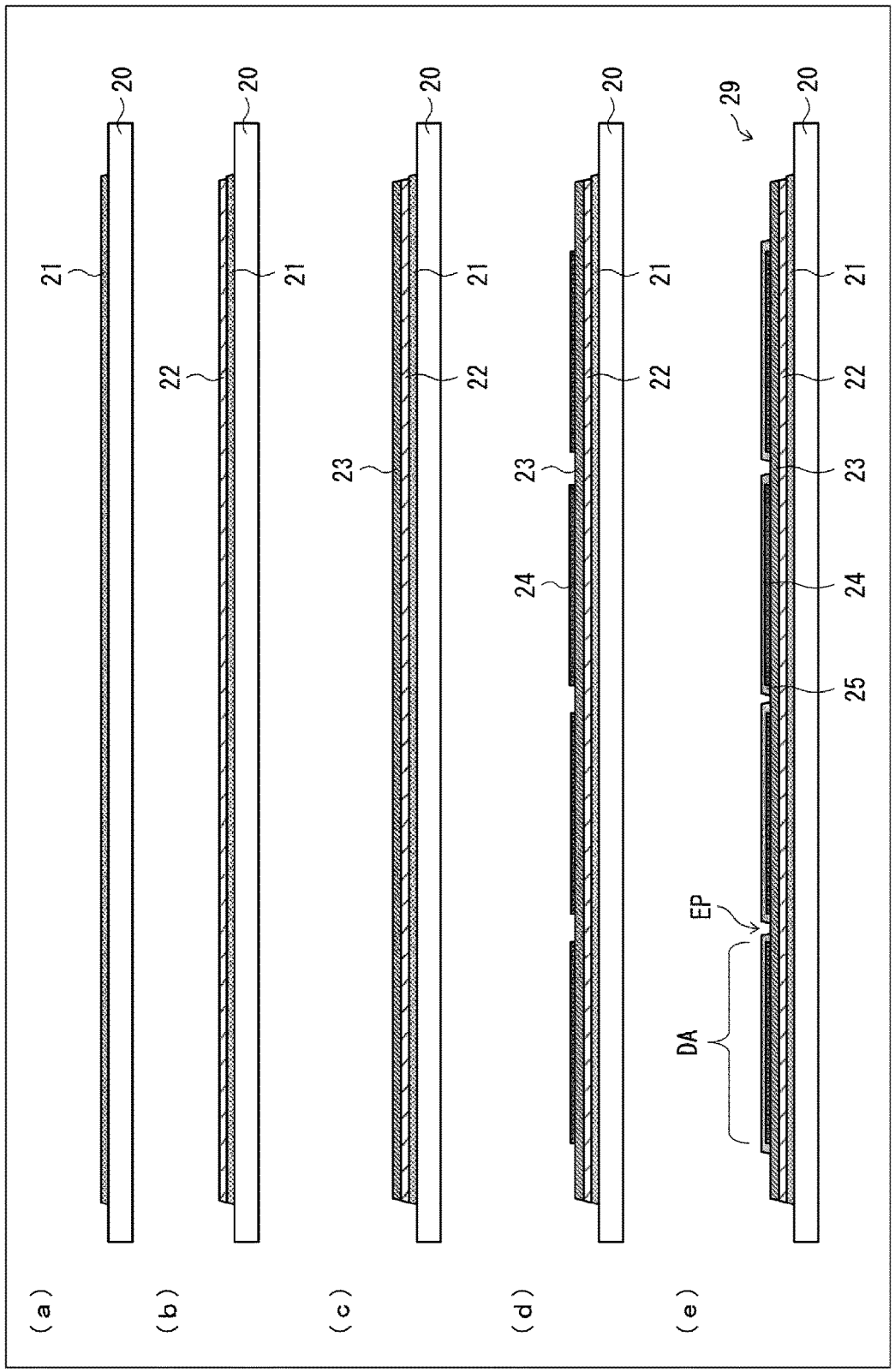
FIGS. 2(a) to 2(e) are diagrams explaining the step of forming a non-flexible display element substrate.

FIG. 1 and (a) of FIG. 2 to (e) of FIG. 2 are diagrams explaining a step of forming a non-flexible display element substrate 29.

As illustrated in FIG. 1, the step of forming a non-flexible display element substrate 29 includes: a resin layer forming step (S1) of forming a resin layer 21 on a non-flexible first support substrate 20; a barrier layer forming step (S2) of forming a barrier layer 22 on the resin layer 21; a transistor layer forming step (S3) of forming a transistor layer 23 on the barrier layer 22; a light-emitting element layer forming step (S4) of forming a light-emitting element layer 24 on the transistor layer 23; and a sealing layer forming step (S5) of forming a sealing layer 25 on the light-emitting element layer 24.

In the resin layer forming step (S1) illustrated in (a) of FIG. 2, the resin layer 21 was formed on the non-flexible first support substrate 20. As the non-flexible first support substrate 20, for example, a glass substrate can be used, and as the resin layer 21, for example, a polyimide resin, an epoxy resin, a polyamide resin, or the like can be used, but no such limitation is intended.

In the barrier layer forming step (S2) illustrated in (b) of FIG. 2, the barrier layer 22 is formed on the resin layer 21. As the barrier layer 22, for example, a silicon oxide film, a silicon nitride film, or a silicon oxynitride film formed by using CVD, or a layered film formed by layering these films can be used, but this is not restrictive.

In the transistor layer forming step (S3) illustrated in (c) of FIG. 2, the transistor layer 23 is formed on the barrier layer 22. The transistor layer 23 is a layer including a thin film transistor element (TFT element) and a capacitance element, and includes, for example, a semiconductor film, a plurality of types of insulating films, and a plurality of types of electrodes.

In the light-emitting element layer forming step (S4) illustrated in (d) of FIG. 2, the light-emitting element layer 24 is formed on the transistor layer 23. The light-emitting element layer 24 is a layer including, for example, an Organic Light Emitting Diode (OLED), an inorganic light-emitting diode, or a Quantum dot Light Emitting Diode (QLED), and includes an anode electrode, a cathode electrode, and a function layer including a light-emitting layer provided between the anode electrode and the cathode electrode. Note that examples of the function layer other than the light-emitting layer include an electron injection layer, an electron transport layer, a hole injection layer, a hole transport layer, an electron blocking layer, and a hole blocking layer, but this is not restrictive.

In the sealing layer forming step (S5) illustrated in (e) of FIG. 2, the sealing layer 25 is formed on the light-emitting element layer 24. The sealing layer 25 is transparent, and for example, may use a sealing layer constituted by one layer of an organic film and two layers of inorganic films, which includes the organic sealing film between a first inorganic sealing film and a second inorganic sealing film, may be formed of only one or more inorganic films or one or more organic films, or may be formed of two or more inorganic films and two or more organic films. As illustrated in (e) of FIG. 2, the non-flexible display element substrate 29 is a display element assembly substrate including a plurality of display regions DA, each of the plurality of display elements including a display region DA and a terminal portion EP.

Figure 3:
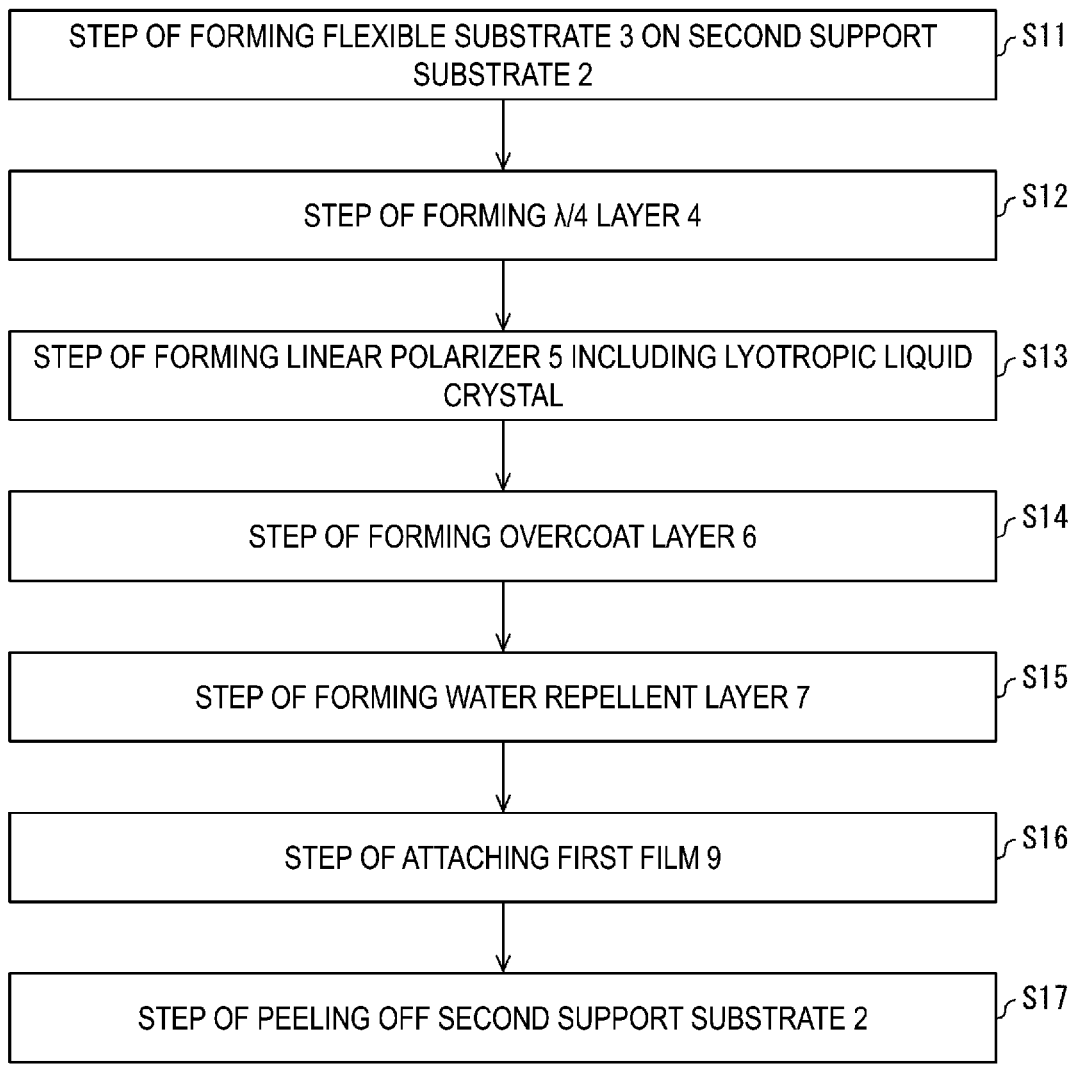
FIG. 3 is a diagram explaining a step of forming a circular polarizer provided in a flexible display device according to a first embodiment.
Figure 4:
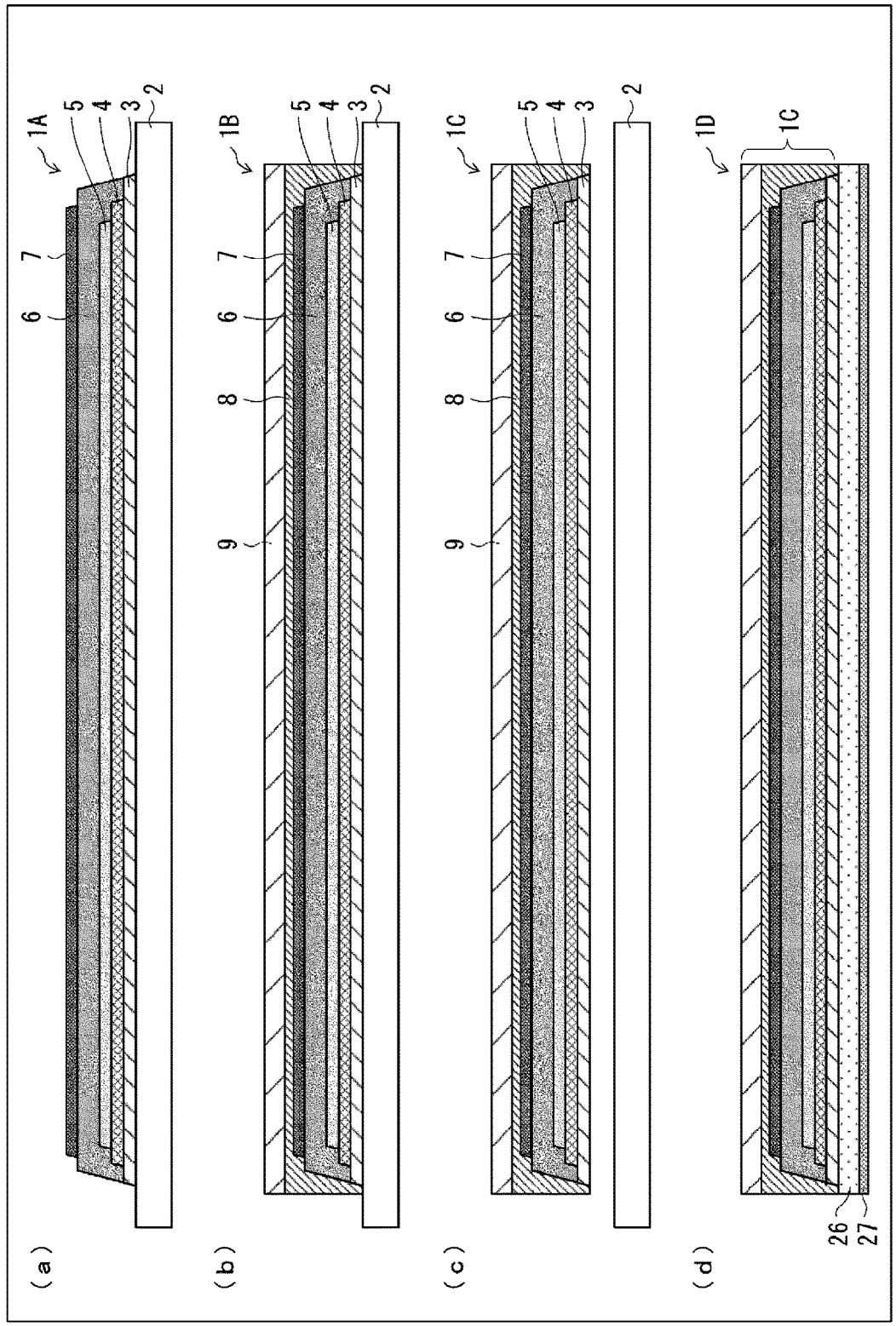
FIGS. 4(a) to 4(d) are diagrams for explaining a step of forming the circular polarizer provided in the flexible display device according to the first embodiment.

FIG. 3 and (a) of FIG. 4 to (d) of FIG. 4 are diagrams for explaining a step of forming a flexible circular polarizer 1C.

As illustrated in FIG. 3, the step of forming the flexible circular polarizer 1C includes: a first flexible substrate forming step (S11) of forming a first flexible substrate 3 on a non-flexible second support substrate 2; a phase difference plate forming step (S12) of forming a phase difference plate, $\lambda/4$ layer 4, on the first flexible substrate 3; a linear polarizer forming step (S13) of forming a linear polarizer 5 including a lyotropic liquid crystal on the $\lambda/4$ layer 4; an overcoat layer forming step (S14) of forming an overcoat layer 6 on the linear polarizer 5; a water repellent layer forming step (S15) of forming a water repellent layer 7 on the overcoat layer 6; a step (S16) of attaching a first film 9 onto the water repellent layer 7 via an adhesive layer (adhesive layer) 8; and a non-flexible second support substrate peeling step (S17) of peeling off the non-flexible second support substrate 2 from the first flexible substrate 3.

In the first flexible substrate forming step (S11), the phase difference plate forming step (S12), the linear polarizer forming step (S13), the overcoat layer forming step (S14), and the water repellent layer forming step (S15) illustrated in (a) of FIG. 4, the first flexible substrate 3 is formed on the non-flexible second support substrate 2, the $\lambda/4$ layer 4 is formed on the first flexible substrate 3, the linear polarizer 5 including the lyotropic liquid crystal is formed on the $\lambda/4$ layer 4, the overcoat layer 6 is formed on the linear polarizer 5, and the water repellent layer 7 is formed on the overcoat layer 6, in this order. As the non-flexible second support substrate 2, for example, a glass substrate can be used, but this is not restrictive. As the first flexible substrate 3, for example, a polyimide resin, an epoxy resin, a polyamide resin, or the like can be used, but this is not restrictive. The thickness of the first flexible substrate 3 is preferably 10 to 50 μm, but this is not restrictive. Note that in the present embodiment, a polyimide resin is used as the first flexible substrate 3. The $\lambda/4$ layer 4 can be formed using a commercially available product commonly used in the field of display devices and the like, and the thickness thereof is preferably 1 to 3 μm, but this is not restrictive. The linear polarizer 5 including the lyotropic liquid crystal can be formed by a method for applying and drying a commercially available solution commonly used in the field of display devices or the like including a dichroic pigment such as a lyotropic liquid crystal (LCLC), and the thickness after drying is preferably not less than 0.1 µm and not greater than 1 µm, but this is not restrictive. Note that in the present embodiment, the lyotropic chromonic liquid crystal is used as the lyotropic liquid crystal, but this is not restrictive. The λ/4 layer 4 may be formed on an alignment film as necessary, and the linear polarizer 5 including the lyotropic liquid crystal may also be formed on the alignment film as necessary. Note that the thickness of these alignment films is preferably 50 to 200 nm, but this is not restrictive. The overcoat layer 6 can be formed using a commercially available product commonly used in the field of display devices and the like, and the thickness thereof is preferably not less than 1 µm and not greater than 5 µm, but this is not restrictive. The water repellent layer 7 can be formed by applying and drying (or spraying and drying) a commercially available water repellent coating agent, and, for example, a fluorine resin-containing solvent, fluorine resin-containing petroleum-based hydrocarbon, silicone oil, or the like can be used as the water repellent coating agent of the application type (spray type). The thickness of the water repellent layer 7 is preferably not less than 0.5 µm and not greater than 5 µm, but this is not restrictive.

In the present embodiment, as in the non-flexible circular polarizer 1A illustrated in (a) of FIG. 4, each end portion of the first flexible substrate 3 and each end portion of the overcoat layer 6 are formed so as to substantially match each other, and each end portion of the water repellent layer 7 is formed so as to be located inside each end portion of the first flexible substrate 3 and each end portion of the overcoat layer 6, but this is not restrictive, and each end portion of the water repellent layer 7 may be formed so as to substantially match each end portion of the first flexible substrate 3 and each end portion of the overcoat layer 6. Each end portion of the λ/4 layer 4 may be formed so as to be located inside each end portion of the water repellent layer 7, or may be formed so as to substantially match each end portion of the water repellent layer 7. Each end portion of the linear polarizer 5 including the lyotropic liquid crystal may be formed so as to be located inside each end portion of the λ/4 layer 4, or may be formed so as to substantially match each end portion of the λ/4 layer 4.

In the present embodiment, the water repellent layer 7 is formed as one continuous layer on the entire surface of a specific region on the overcoat layer 6, but this is not restrictive, and the water repellent layer 7 may be provided on the entire surface of the overcoat layer 6, and as in a second embodiment described below, the water repellent layer may be patterned so as to have a plurality of openings as long as the water repellent layer overlaps with at least the end portion of the overcoat layer provided in the flexible display device that is singulated after the partitioning step.

In the step (S16) of attaching the first film 9 illustrated in (b) of FIG. 4, a circular polarizer 1B provided with the first film 9 can be obtained by attaching the first film 9 onto the water repellent layer 7 via the adhesive layer 8. The adhesive layer 8 and the first film (film) 9 protect the non-flexible circular polarizer 1A illustrated in (a) of FIG. 4 in the later step, and although the types thereof are not particularly limited, it is preferable to use ones that easily peel off when the adhesive layer 8 and the first film 9 become unnecessary after a predetermined step. Note that in the present embodiment, each end portion of the adhesive layer 8 and each end portion of the first film 9 are formed so as to be located outside each end portion of the first flexible substrate 3, but this is not restrictive. Note that the step of attaching the first film 9 (S16) may be omitted as appropriate.

In the non-flexible second support substrate peeling step (S17) of peeling off the non-flexible second support substrate 2 from the first flexible substrate 3 illustrated in (c) of FIG. 4, the flexible circular polarizer 1C can be obtained by irradiating the first flexible substrate 3 with laser light via the non-flexible second support substrate 2, and peeling off the non-flexible second support substrate 2 from the first flexible substrate 3.

As illustrated in (d) of FIG. 4, a flexible circular polarizer 1D provided with an adhesive layer 26 can be obtained by forming the adhesive layer 26 on the surface of the first flexible substrate 3 of the flexible circular polarizer 1C illustrated in (c) of FIG. 4 from which the non-flexible second support substrate 2 is peeled off, and then attaching a second film 27 that protects the adhesive layer 26. The adhesive layer 26 is a layer that is not peeled off in the later step, and thus it is preferable to use, for example, an Optical Clear Adhesive (OCA) or and Optical Clear Resin (OCR). The type of second film 27 is not particularly limited, but it is preferable to use a film that can be easily peeled off when the second film 27 becomes unnecessary after a predetermined step. Note that the second film 27 is a film that protects the adhesive layer 26, and thus the second film 27 needs to be peeled off before the adhesive force of the adhesive layer 26 increases.

Figure 5:
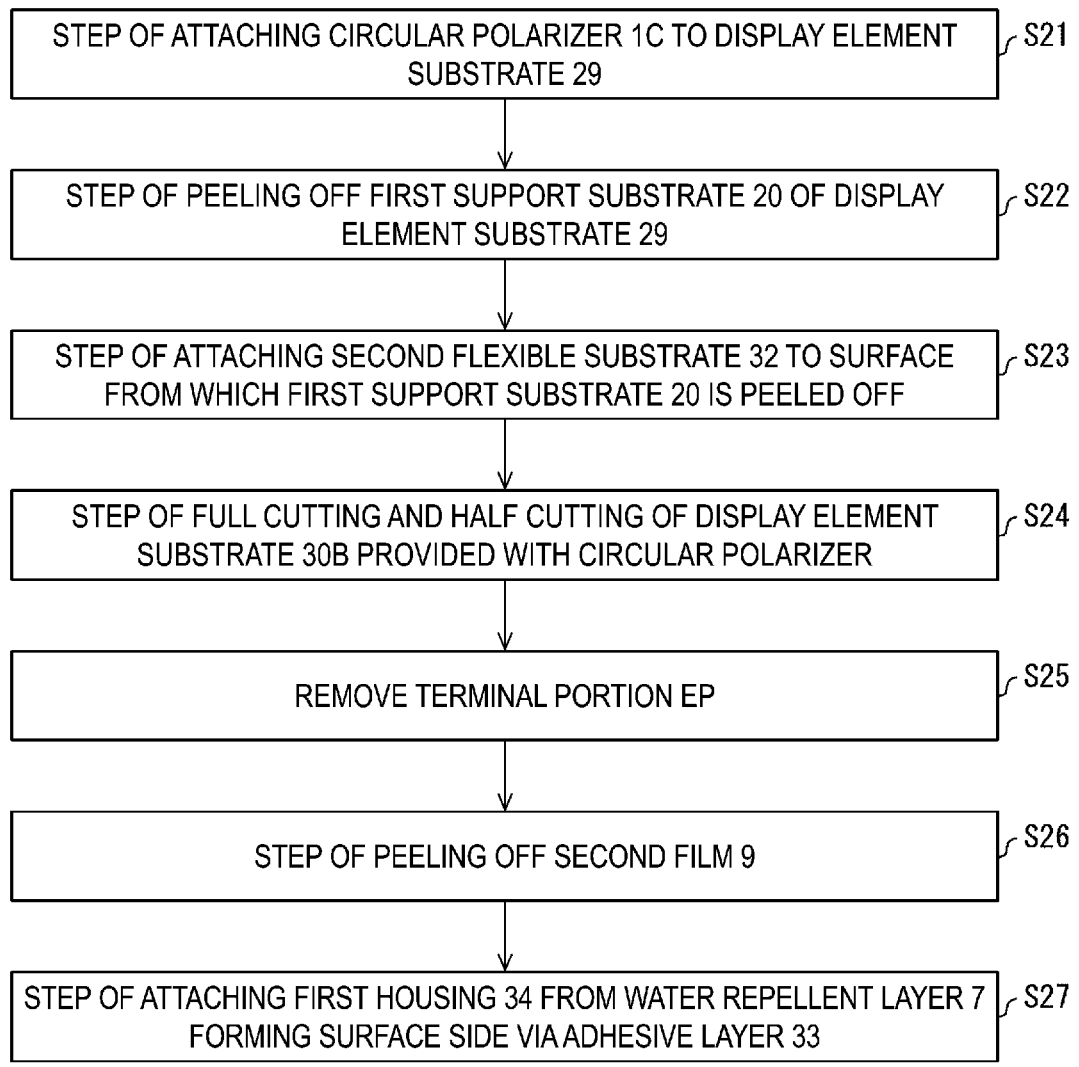
FIG. 5 is a diagram explaining a manufacturing process of the flexible display device according to the first embodiment that includes a step of forming a flexible display element provided with a circular polarizer.
Figure 6:
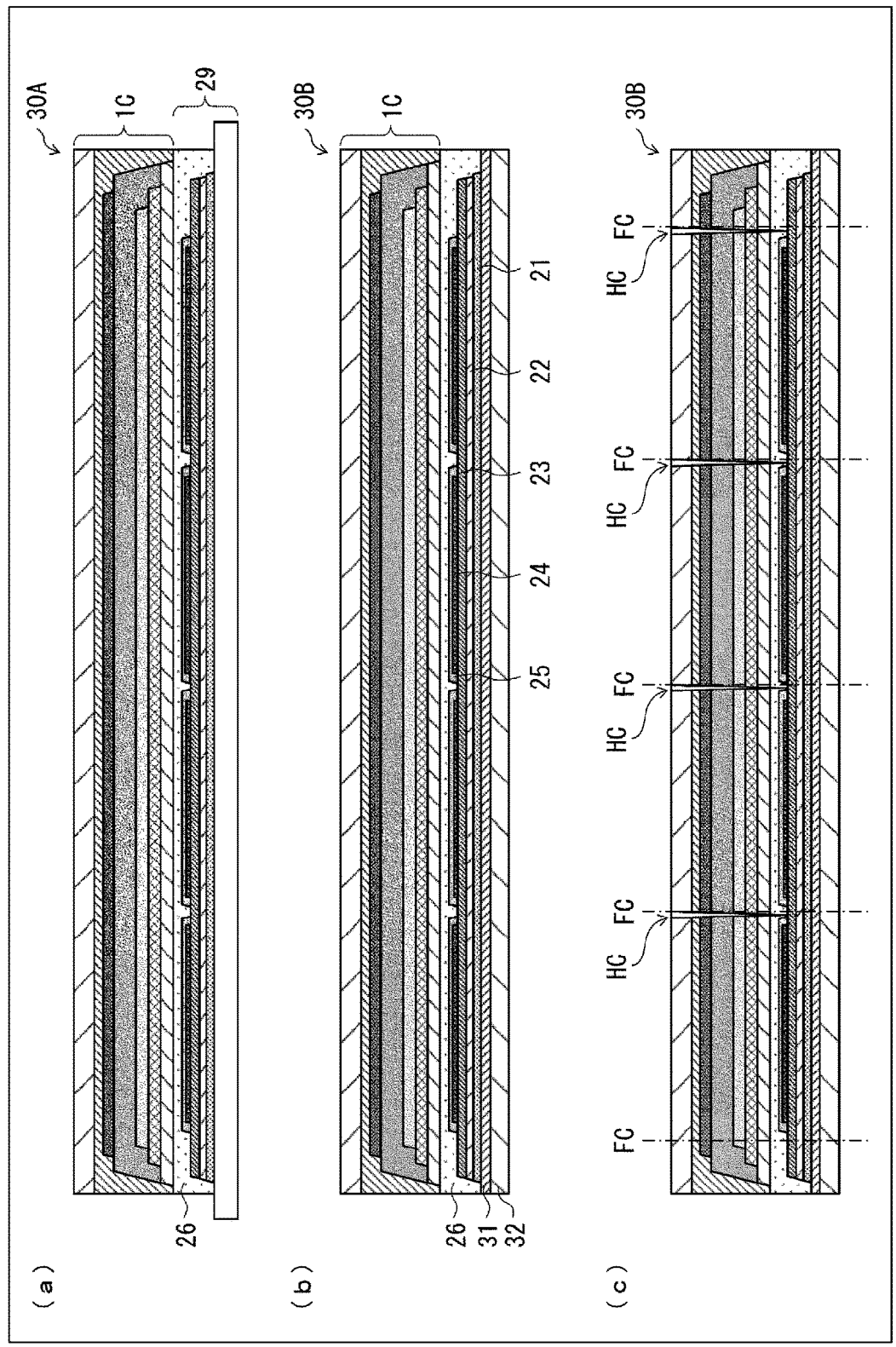
FIGS. 6(a) to 6(c) are diagrams illustrating a part of the manufacturing process of the flexible display device according to the first embodiment.
Figure 7:
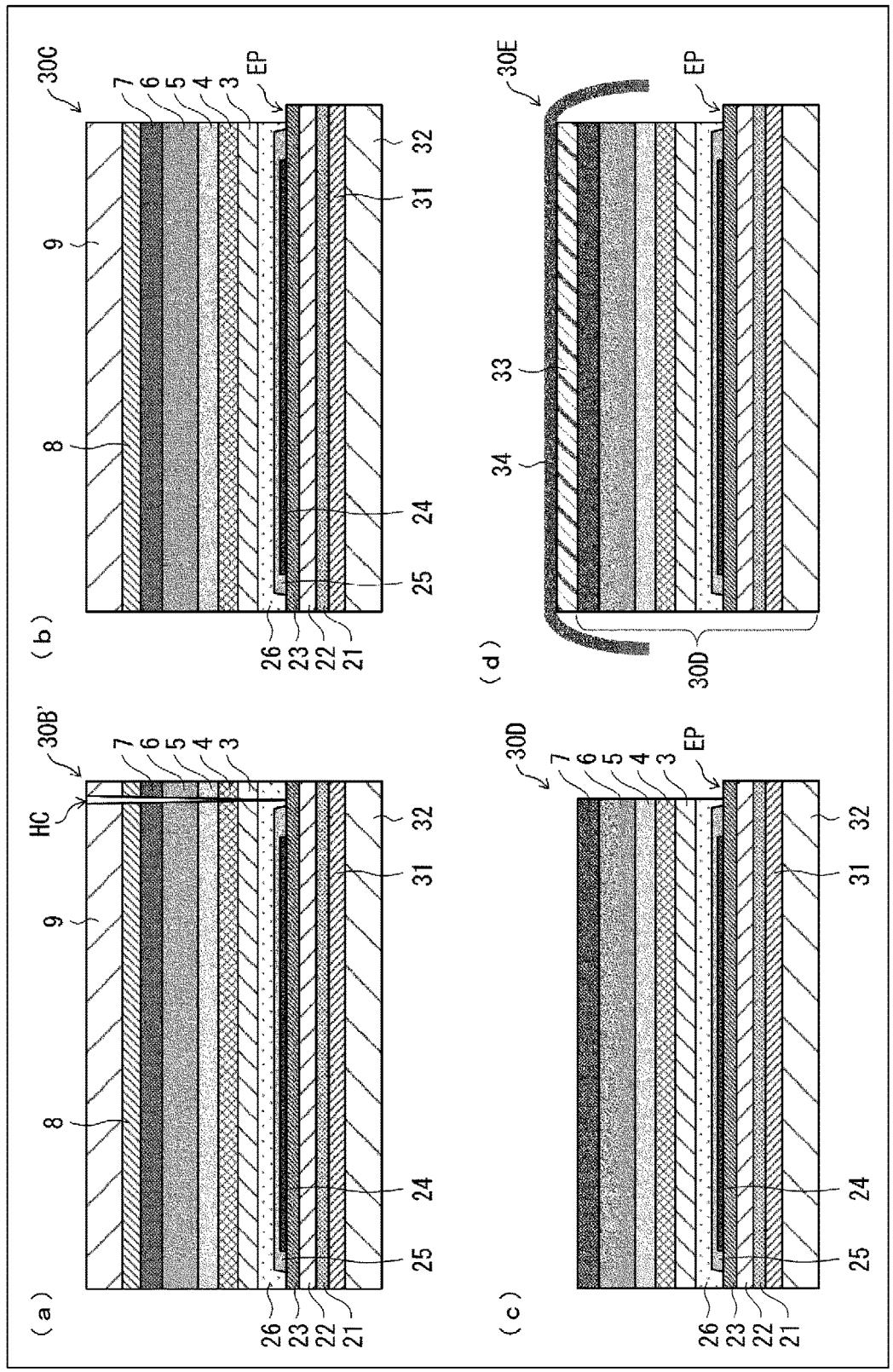
FIGS. 7(a) to 7(d) are diagrams illustrating the remaining part of the manufacturing process of the flexible display device according to the first embodiment.

FIG. 5, (a) of FIG. 6 to (c) of FIG. 6, and (a) of FIG. 7 to (d) of FIG. 7 are diagrams for explaining a manufacturing process of a flexible display device 30E.

As illustrated in FIG. 5, the manufacturing process of the flexible display device 30E includes a step of forming a flexible display element provided with a circular polarizer. The step of forming the flexible display element provided with the circular polarizer includes: a circular polarizer bonding step (S21) of bonding the flexible circular polarizer 1C illustrated in (c) of FIG. 4 and (d) of FIG. 4 on the sealing layer 25 of the non-flexible display element substrate 29 illustrated in (d) of FIG. 2 via the adhesive layer 26; a non-flexible first support substrate peeling step (S22) of peeling off the non-flexible first support substrate 20 from the resin layer 21 of the non-flexible display element substrate 29; a second flexible substrate attaching step (S23) of attaching a second flexible substrate 32 to a surface of the resin layer 21 of the non-flexible display element substrate 29 from which the non-flexible first support substrate 20 is peeled off; a step (S24) of full cutting and half cutting a flexible display element substrate 30B provided with the circular polarizer; a step (S25) of removing the terminal portion EP; a step (S26) of peeling off the first film 9 including the adhesive layer 8; and a step (S27) of attaching a first housing 34 from the water repellent layer 7 forming surface side via an adhesive layer 33.

In the present embodiment, description is given by taking, as an example, a case in which the second flexible substrate attaching step (S23) of attaching the second flexible substrate 32 is performed on the surface of the resin layer 21 of the non-flexible display element substrate 29 from which the non-flexible first support substrate 20 is peeled off. However, this is not restrictive, and the resin layer 21 of the non-flexible display element substrate 29 may be used as is as a flexible substrate, and in this case, the second flexible substrate attaching step (S23) can be omitted.

In the circular polarizer bonding step (S21) illustrated in (a) of FIG. 6, a non-flexible display element substrate 30A provided with the circular polarizer 1C can be obtained by attaching the flexible circular polarizer 1C illustrated in (c) of FIG. 4 and (d) of FIG. 4 to the sealing layer 25 of the non-flexible display element substrate 29 illustrated in (d) of FIG. 2 via the adhesive layer 26.

In the non-flexible first support substrate peeling step (S22) and the second flexible substrate attaching step (S23) illustrated in (a) of FIG. 6 and (b) of FIG. 6, the flexible display element substrate 30B provided with the circular polarizer 1C can be obtained by irradiating the resin layer 21 via the non-flexible first support substrate 20 with laser light, peeling off the non-flexible first support substrate 20 from the resin layer 21, and attaching the second flexible substrate 32 to the surface of the resin layer 21 from which the non-flexible first support substrate 20 is peeled off via an adhesive layer 31. Note that in the present embodiment, the polyimide resin is used as the resin layer 21, but this is not restrictive. As the adhesive layer 31, for example, an Optical Clear Adhesive (OCA) or an Optical Clear Resin (OCR) is preferably used. Examples of the material of the second flexible substrate 32 include polyethylene terephthalate (PET) and the like, but this is not restrictive.

In the step (S24) of full cut FC and half cut HC of the flexible display element substrate 30B provided with the circular polarizer 1C illustrated in (c) of FIG. 6, the display element assembly substrate including the plurality of display regions DA can be singulated, for example, into individual display regions DA, by the partitioning step of full cut FC and half cut HC of the flexible display element substrate 30B provided with the circular polarizer 1C. In other words, the flexible display element substrate 30B provided with the circular polarizer 1C, which is the display element assembly substrate including the plurality of display regions DA, becomes a flexible display element substrate 30B' provided with a singulated circular polarizer 1C and including, for example, one display region DA and a terminal portion EP illustrated in (a) of FIG. 7, by the full cut FC. The half cut HC is a step that is performed to easily remove the terminal portion EP, and is a step of cutting only some of the layers of the flexible display element substrate 30B provided with the circular polarizer 1C.

Note that, in the present embodiment, description is given by taking, as an example, a case in which the partitioning step described above is performed after the flexible circular polarizer 1C is bonded to the sealing layer 25 of the non-flexible display element substrate 29 via the adhesive layer 26. However, this is not restrictive, and as described below, the partitioned non-flexible display element substrate and the partitioned non-flexible circular polarizer may be bonded after the partitioning step of the non-flexible display element substrate 29 illustrated in (d) of FIG. 1 and the partitioning step of the circular polarizer 1B illustrated in (b) of FIG. 4 are performed.

In the step (S25) of removing the terminal portion EP illustrated in (b) of FIG. 7, the half cut HC portion is peeled off, and a flexible display element substrate 30C provided with the circular polarizer 1C with the terminal portion EP exposed can be obtained.

In the step (S26) of peeling off the first film 9 including the adhesive layer 8 illustrated in (c) of FIG. 7, the adhesive layer 8 and the first film 9 are peeled off, and a flexible display element substrate 30D provided with a circular polarizer not including the first film 9 can be obtained.

In the step (S27) of attaching the first housing 34 from the water repellent layer 7 forming surface side via the adhesive layer 33 as illustrated in (d) of FIG. 7, the flexible display device 30E can be obtained by attaching the first housing 34 to the water repellent layer 7 of the flexible display element substrate 30D via the adhesive layer 33.

Figure 8:
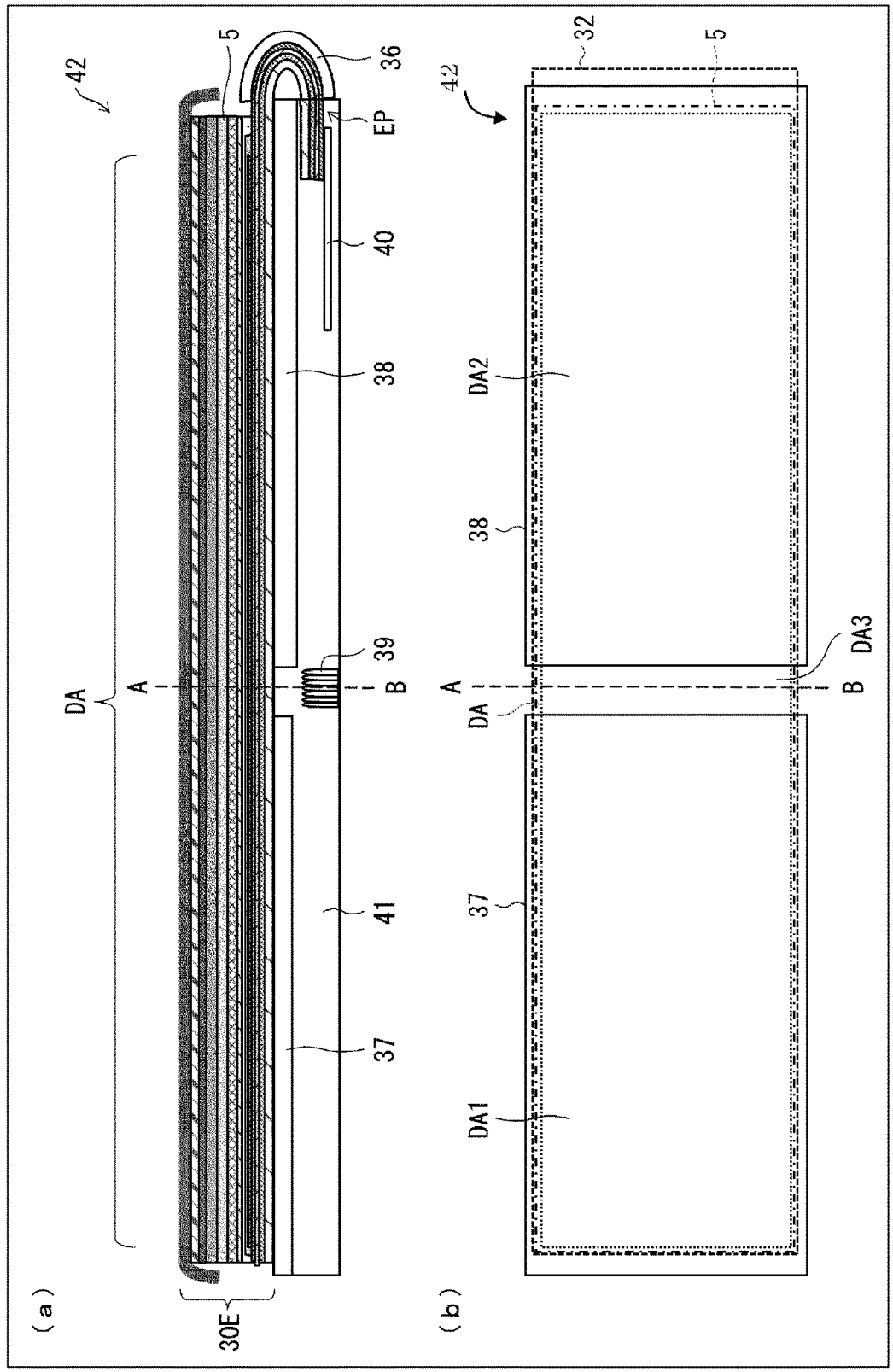
FIGS. 8(a) and 8(b) are diagrams explaining a schematic configuration of a foldable display device including the flexible display device according to the first embodiment.

(a) of FIG. 8 is a diagram illustrating a schematic configuration of a foldable display device 42 including the flexible display device 30E, and (b) of FIG. 8 is a plan view of the foldable display device 42.

As illustrated in (a) of FIG. 8, a display region DA including a light-emitting element layer 24, a frame region, which is a region surrounding the display region DA, and a terminal portion EP on one end of the frame region are provided on the second flexible substrate 32 of the flexible display device 30E included in the foldable display device 42.

As illustrated in (a) of FIG. 8 and (b) of FIG. 8, the second flexible substrate 32 has four sides, and at sides other than the side provided with the terminal portion EP among the four sides (the upper side, the lower side, and the left side in the drawing), the end portions of the second flexible substrate 32, the transistor layer 23, the first flexible substrate 3, the λ/4 layer 4, which is the phase difference plate, the linear polarizer 5 including the lyotropic liquid crystal, the overcoat layer 6, and the water repellent layer 7 are provided in alignment to each other. Note that in (b) of FIG. 8, only the linear polarizer 5 including the lyotropic liquid crystal is illustrated as one of the plurality of layers provided with the end portions aligned to each other.

Between the terminal portion EP of the side provided with the terminal portion EP and the display region DA (the right side in the drawing) among the four sides, the end portions of the first flexible substrate 3, the λ/4 layer 4, which is the phase difference plate, the linear polarizer 5 including the lyotropic liquid crystal, the overcoat layer 6, and the water repellent layer 7 are provided in alignment to each other.

Note that the terminal portion EP is provided on one end of the transistor layer 23 exposed from the sealing layer 25, the first flexible substrate 3, the λ/4 layer 4, which is the phase difference plate, the linear polarizer 5 including the lyotropic liquid crystal, the overcoat layer 6, and the water repellent layer 7.

As illustrated in (a) of FIG. 8 and (b) of FIG. 8, the foldable display device 42 includes the flexible display device 30E, a first non-flexible support substrate 37 that supports a first display region DA1 that is part of the display region DA of the flexible display device 30E, and a second non-flexible support substrate 38 that supports a second display region DA2 that is another part of the display region DA of the flexible display device 30E. A third display region DA3, which is still another part of the display region DA of the flexible display device 30E, is a display region between the first display region DA1 and the second display region DA2, and is a display region that overlaps with a gap between the first non-flexible support substrate 37 and the second non-flexible support substrate 38 in the display region DA of the flexible display device 30E. Then, the flexible display device 30E is bent in the third display region DA3, and the foldable display device 42 can be folded along the line A-B illustrated in (a) of FIG. 8 and (b) of FIG. 8, for example.

Note that in the present embodiment, the first non-flexible support substrate 37 and the second non-flexible support substrate 38 are attached to the second flexible substrate 32 via the adhesive layer. However, other methods may be used as long as the first non-flexible support substrate 37 and the second non-flexible support substrate 38 can be fixed to the second flexible substrate 32. In the present embodiment, the first non-flexible support substrate 37 and the second non-flexible support substrate 38 are attached to the second housing 41 via the adhesive layer. However, other methods may be used as long as the first non-flexible support substrate 37 and the second non-flexible support substrate 38 can be fixed to the second housing 41.

Note that in the present embodiment, description is given by taking, as an example, a case in which the foldable display device 42 includes two non-flexible support substrates. However, this is not restrictive, and may include three or more non-flexible support substrates, or may include two or more bendable portions.

As illustrated in (a) of FIG. 8, a flexible printed circuit board (FPC board) 40 is electrically connected to the terminal portion EP of the flexible display device 30E. Then, a portion of the flexible display device 30E that is outside the display region DA and part of a portion at and near which the terminal portion EP is formed is bent and is turned to the back face of the second non-flexible support substrate 38. A protection layer 36 is provided in the part of the portion at and near which the terminal portion EP is formed and that is bent.

The first non-flexible support substrate 37 and the second non-flexible support substrate 38 are provided on the second housing 41, and the flexible printed circuit board 40, the terminal portion EP, and an elastic support body 39 are housed in the second housing 41. In the present embodiment, description is given by taking, as an example, a case in which the foldable display device 42 includes the elastic support body 39. However, the present embodiment is not limited to this, and the foldable display device 42 may include a hinge or the like instead of the elastic support body 39.

As illustrated in (b) of FIG. 8, the first non-flexible support substrate 37 has four sides, and at the inside of sides (or may be at the sides) (the upper side, the lower side, and the left side in the drawing) other than the side among the four sides that is in contact with the gap, the end portions of the second flexible substrate 32, the transistor layer 23, the first flexible substrate 3, the $\lambda/4$ layer 4, which is the phase difference plate, the linear polarizer 5 including the lyotropic liquid crystal, the overcoat layer 6, and the water repellent layer 7 are provided in alignment to each other. The second non-flexible support substrate 38 has four sides, and at the inside of two sides (or may be at the sides) (the upper side and the lower side in the drawing) other than the side that is in contact with the gap and the side on the terminal portion EP side among the four sides, the end portions of the second flexible substrate 32, the transistor layer 23, the first flexible substrate 3, the $\lambda/4$ layer 4, which is the phase difference plate, the linear polarizer 5 including the lyotropic liquid crystal, the overcoat layer 6, and the water repellent layer 7 are provided in alignment to each other. Furthermore, between the terminal portion EP of the side provided with the terminal portion EP and the display region DA (the right side in the drawing) among the four sides of the second non-flexible support substrate 38, the end portions of the first flexible substrate 3, the $\lambda/4$ layer 4, which is the phase difference plate, the linear polarizer 5 including the lyotropic liquid crystal, the overcoat layer 6, and the water repellent layer 7 are provided in alignment to each other.

In the case of the flexible display device 30E, by providing the water repellent layer 7, the invasion of hydrophilic material such as water into the linear polarizer 5 including the lyotropic liquid crystal can be suppressed, and therefore, as is known, it has high productivity compared to a case where a linear polarizer including a lyotropic liquid crystal is insolubilized or an overcoat material is also provided on the cut surfaces. For a similar reason, the foldable display device 42 that includes the flexible display device 30E also has high productivity.

FIG. 24 is a diagram illustrating test results for samples 1 to 7 in which the degree of invasion of water into a linear polarizer including a lyotropic liquid crystal is confirmed.

Sample 4 is a sample in which a linear polarizer including a lyotropic liquid crystal and an overcoat are formed on a glass substrate in this order, and are cut to a size of 3 cm×3 cm. Sample 1 is a sample sprayed with a commercially available water repellent coating agent on the overcoat of the sample 4. Sample 2 is a sample in which a linear polarizer including a lyotropic liquid crystal is formed on a glass substrate, and is cut to a size of 3 cm×3 cm, and then a super water repellent moth-eye film is adhered by adhesive glue onto the linear polarizer. Sample 3 is a sample in which a linear polarizer including a lyotropic liquid crystal is formed on a glass substrate, and is cut to a size of 3 cm×3 cm, and then a super water repellent moth-eye film is adhered by adhesive glue only to the edge on the linear polarizer. Note that, in the sample 2 and the sample 3, a super water repellent moth-eye film as disclosed in International Publication (WO 2016/174893 A1) was used as the super water repellent moth-eye film. Sample 5 is a sample in which a linear polarizer including a lyotropic liquid crystal is formed on a glass substrate, and is cut to a size of 3 cm×3 cm, and then a PET film is adhered by adhesive glue onto the linear polarizer. Sample 6 is a sample in which a linear polarizer including a lyotropic liquid crystal is formed on a glass substrate, and is cut to a size of 3 cm×3 cm, and then a commercially available water repellent coating agent is sprayed onto the linear polarizer. Sample 7 is a sample in which a linear polarizer including a lyotropic liquid crystal is formed on a glass substrate, and is cut to a size of 3 cm×3 cm.

For the sample 1 to 7, the degree of invasion of water into a linear polarizer including a lyotropic liquid crystal was checked in the following order. First, the surfaces (working surfaces) of the samples 1 to 7 were turned upward and placed on a box of approximately 2 cm×2 cm×2 cm. Thereafter, 10 mL of pure water was added dropwise to the surfaces (working surfaces) of the samples 1 to 7. The 45° tilt samples 1 to 7 were slowly tilted 45° and left in that state for 10 minutes, and the 90° tilt samples 1 to 7 were slowly tilted 90° and left in that state for 10 minutes. For the 45° tilt samples 1 to 7 and 90° tilt samples 1 to 7, it was visually checked whether there was no discoloration (no invasion of water) on the cut surfaces. The cut surfaces were lightly wiped with a cloth to check whether or not the polarized ink was attached to the cloth.

As illustrated in FIG. 24, in the case of the sample 4, discoloration is confirmed on the cut surface and it was confirmed that polarized ink was attached to the cloth in both the case of tilting by 45° and the case of tilting by 90°. Thus, the time until discoloration occurred on the cut surface was measured, and it was confirmed that the time was about 1 minute after in both the case of tilting by 45° and the case of tilting by 90°. At this time, even when the sample was tilted, the droplets did not drop and remained on the cut surface. Note that the contact angle of water at the surface (working surface) of the sample 4 was 56°.

In the case of the sample 5 as well, discoloration is confirmed on the cut surface and it was confirmed that polarized ink was attached to the cloth in both the case of tilting by 45° and the case of tilting by 90°. Thus, the time until discoloration occurred on the cut surface was measured, and the time was about 1 minute after in the case of tilting by 45° and about 2 minutes after in the case of tilting by 90°. At this time, similar to the sample 4, even when the sample was tilted, the droplets did not drop and remained on the cut surface. Note that the contact angle of water at the surface (working surface) of the sample 5 was 61°.

In the case of the sample 6 with a commercially available water repellent coating agent sprayed on a linear polarizer, it was confirmed that an overcoat was required to be formed on the linear polarizer because the polarized ink becomes mottled by spraying the water repellent coating agent.

In the case of the sample 7 in which only a linear polarizer including a lyotropic liquid crystal was formed, it was confirmed that the polarized ink was dissolved in water at the same time as contact with the water.

In the case of the sample 1 in which a commercially available water repellent coating agent was sprayed on the overcoat, discoloration was not confirmed on the cut surface and there was no attachment of polarized ink to the cloth in both the case of tilting by 45° and the case of tilting by 90°. At this time, after tilting the sample, the droplets were confirmed to flow without remaining at the cut surface. Note that the contact angle of water at the surface (working surface) of the sample 1 was 103°.

In the case of the sample 2 in which a super water repellent moth-eye film was adhered to a linear polarizer with adhesive glue as well, discoloration was not confirmed on the cut surface and there was no attachment of polarized ink to the cloth in both the case of tilting by 45° and the case of tilting by 90°. At this time, after tilting the sample, similar to the sample 1, the droplets were confirmed to flow without remaining at the cut surface. Note that the contact angle of water at the surface (working surface) of the sample 2 could not be measured because the super water repellent moth-eye film has a high water repellent effect and water does not adhere to the super water repellent moth-eye film.

In the case of the sample 3 in which a super water repellent moth-eye film was adhered by adhesive glue only to the edge on the linear polarizer as well, the same results as the sample 2 described above were obtained.

From the above results, the contact angle with water of the water repellent layer provided in the flexible display device is preferably not less than 62 degrees and less than 180 degrees, and is further preferably not less than 103 degrees and less than 180 degrees. Note that the water repellent layer 7 provided in the flexible display device 30E described above has a contact angle with water of 103 degrees or greater.

Second Embodiment

Next, a second embodiment according to the disclosure will be described with reference to FIG. 9 and FIG. 12. A flexible display device 60D or 61 according to the present embodiment is different from the first embodiment in that the water repellent layer 7A has an opening and overlaps with at least the end portion of the overcoat layer 6. Other configurations are the same as those described in the first embodiment. For convenience of description, members having the same functions as those of the members illustrated in the diagrams in the first embodiment are denoted by the same reference numerals, and descriptions thereof will be omitted.

Figure 9:
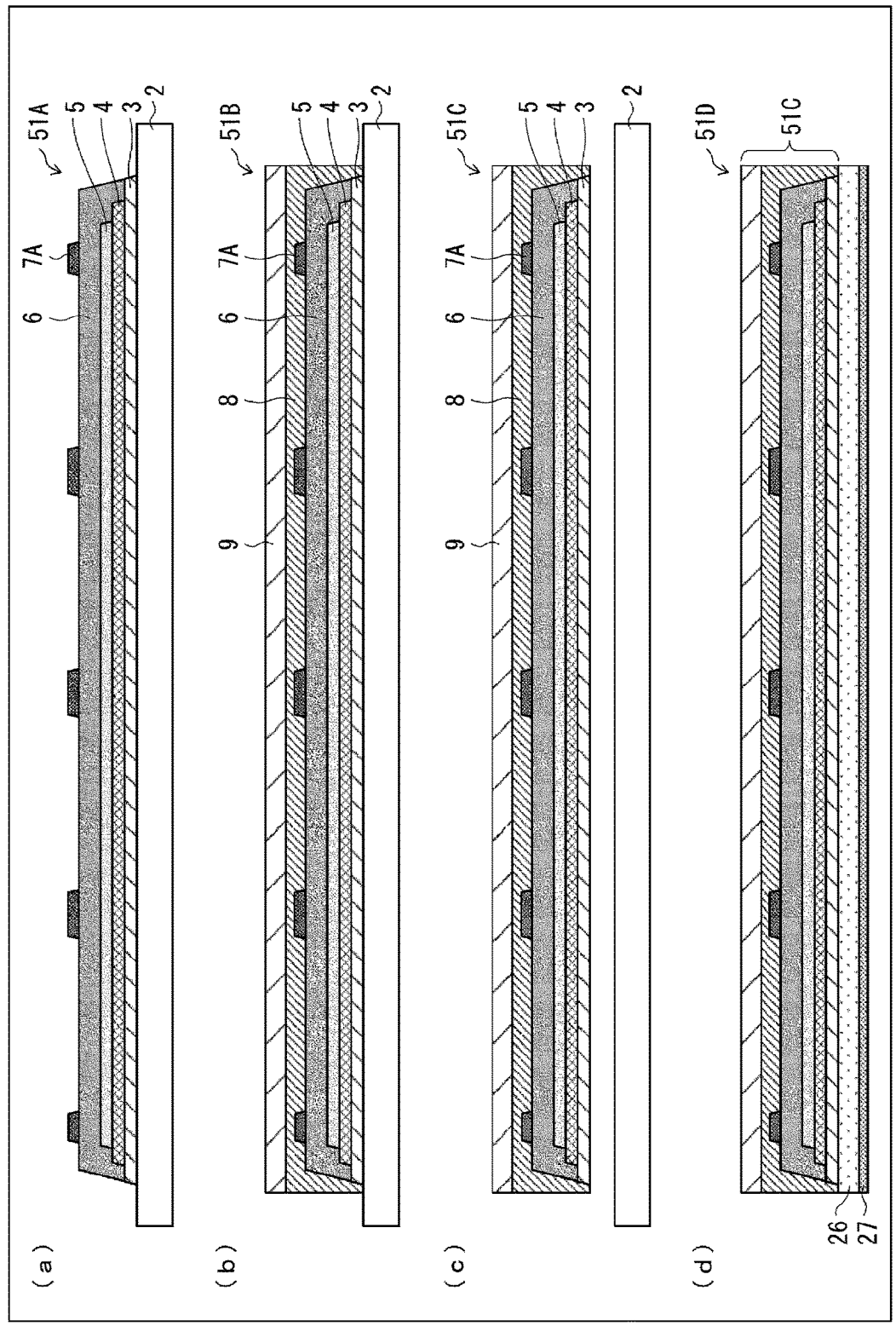
FIGS. 9(a) to 9(d) are diagrams for explaining a step of forming a circular polarizer provided in a flexible display device according to a second embodiment.

(a) of FIG. 9 to (d) of FIG. 9 are diagrams for explaining a step of forming a flexible circular polarizer 51C.

As illustrated in (a) of FIG. 9, in a non-flexible circular polarizer 51A, the water repellent layer 7A is patterned on the overcoat layer 6 so as to have an opening. The water repellent layer 7A can be formed by using a known method such as an ink-jet method or screen printing, for example, of a commercially available coating type (spray type) water repellent coating agent. The thickness of the water repellent layer 7A is preferably not less than 0.5 μm and not greater than 5 μm, but this is not restrictive.

In a non-flexible circular polarizer 51B illustrated in (b) of FIG. 9, the first film 9 is attached to the overcoat layer 6 and the water repellent layer 7A via the adhesive layer 8. The adhesive layer 8 is more easily formed on the overcoat layer 6 than on the water repellent layer 7A, and thus the forming step of the adhesive layer 8 and the step of attaching the first film 9 are made easier because the overcoat layer 6 is exposed from the opening of the water repellent layer 7A.

The flexible circular polarizer 51C illustrated in (c) of FIG. 9 is obtained by irradiating the first flexible substrate 3 with laser light via the non-flexible second support substrate 2, and peeling off the non-flexible second support substrate 2 from the first flexible substrate 3.

The flexible circular polarizer 51D illustrated in (d) of FIG. 9 is obtained by forming the adhesive layer 26 on the surface of the first flexible substrate 3 of the flexible circular polarizer 51C illustrated in (c) of FIG. 9 from which the non-flexible second support substrate 2 is peeled off, and then attaching the second film 27 that protects the adhesive layer 26.

Figure 10:
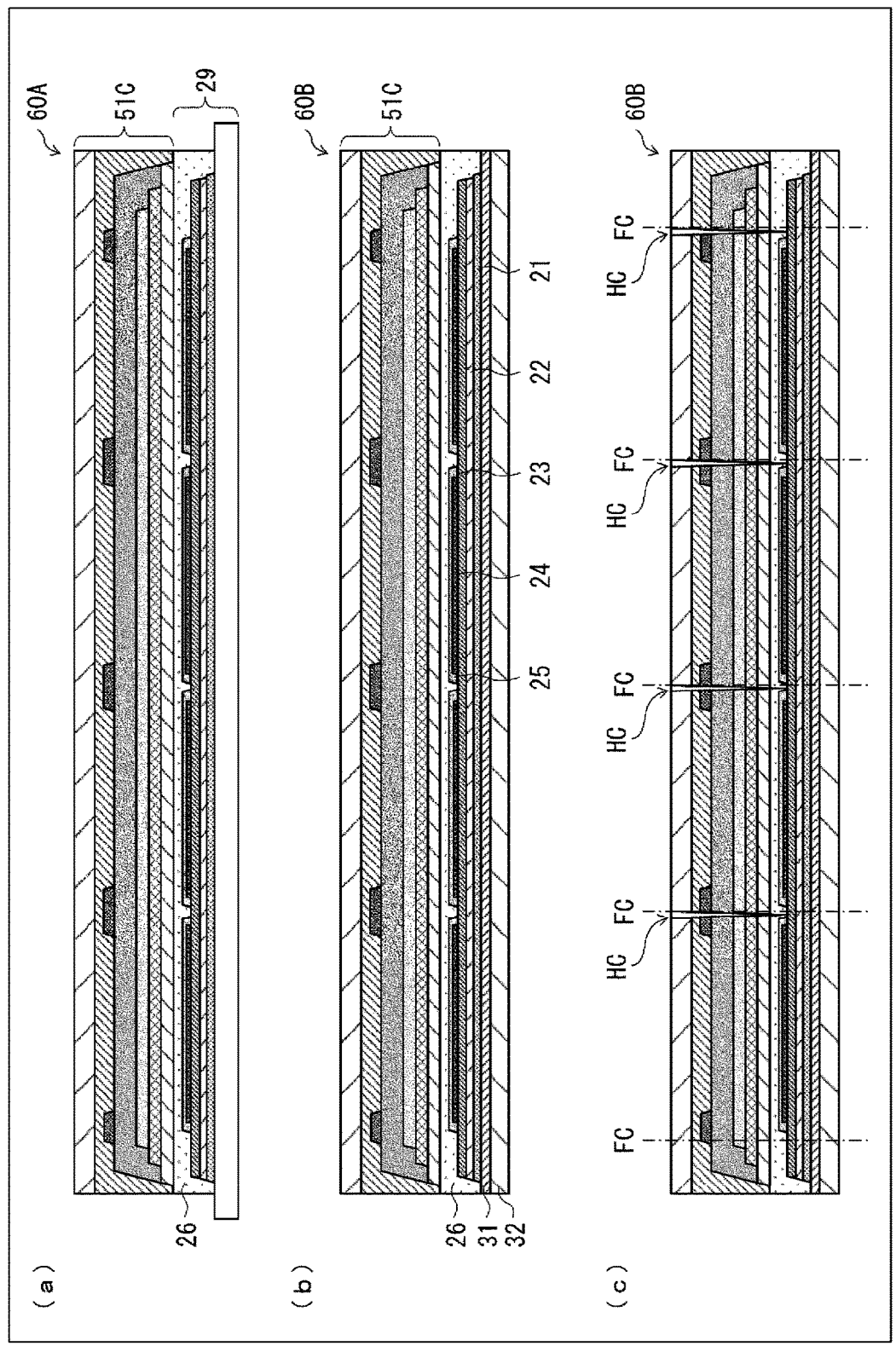
FIGS. 10(a) to 10(c) are diagrams illustrating a part of a manufacturing process of the flexible display device according to the second embodiment.
Figure 11:
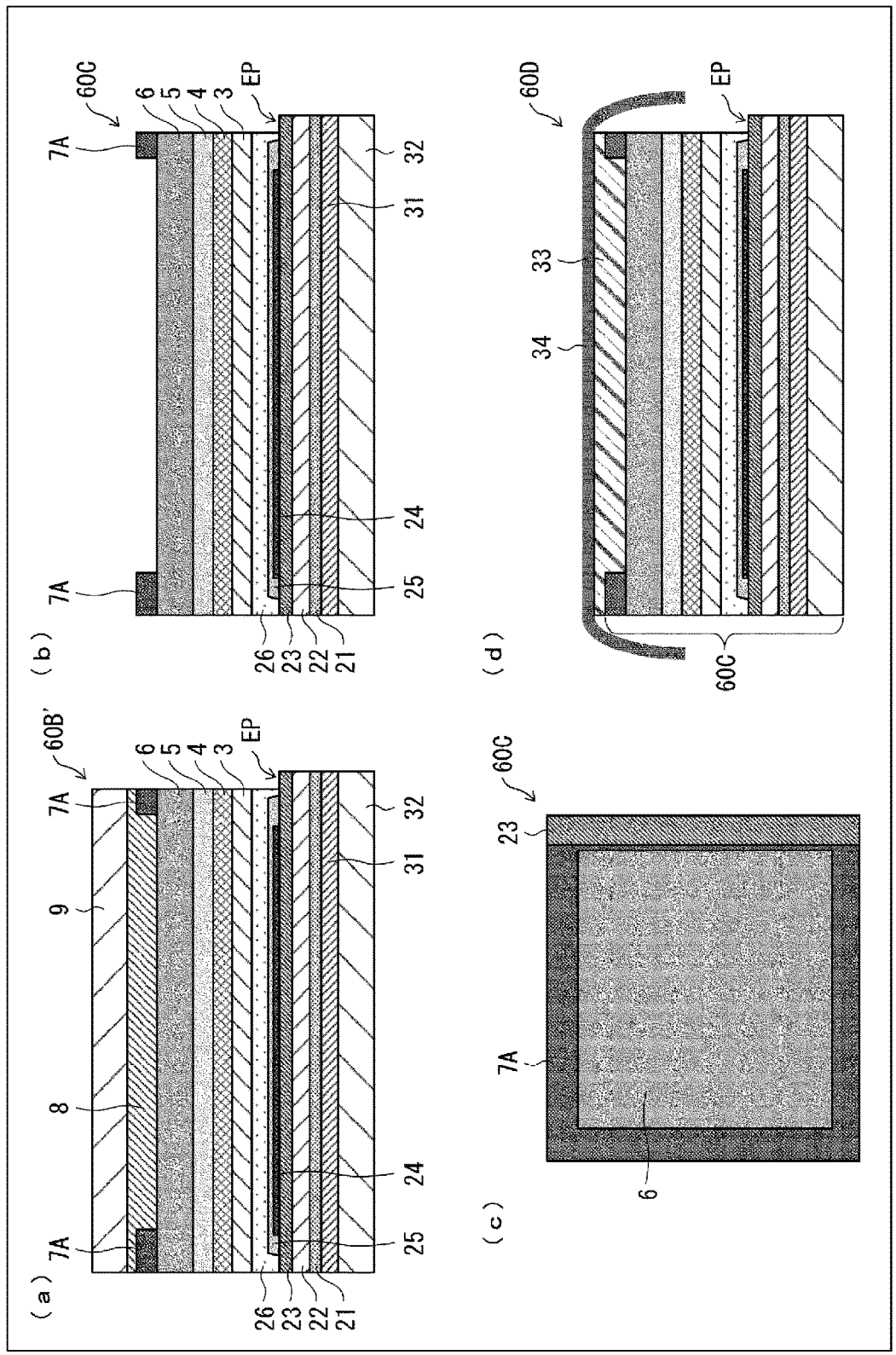
FIGS. 11(a) to 11(d) are diagrams illustrating the remaining part of the manufacturing process of the flexible display device according to the second embodiment.

(a) of FIG. 10 to (c) of FIG. 10 and (a) of FIG. 11 to (d) of FIG. 11 are diagrams for explaining a manufacturing process of a flexible display device 60D.

The non-flexible display element substrate 60A provided with the circular polarizer 51C illustrated in (a) of FIG. 10 can be obtained by bonding the flexible circular polarizer 51C illustrated in (c) of FIG. 9 and (d) of FIG. 9 on the sealing layer 25 of the non-flexible display element substrate 29 illustrated in (d) of FIG. 2 via the adhesive layer 26. Note that in bonding, the bonding needs to be performed by aligning the water repellent layer 7A so as to overlap with at least the end portion of the overcoat layer 6 provided in the flexible display device that is singulated after the partitioning step.

The flexible display element substrate 60B provided with the circular polarizer 51C illustrated in (b) of FIG. 10 can be obtained by irradiating the resin layer 21 with laser light via the non-flexible first support substrate 20 in the non-flexible display element substrate 60A provided with the circular polarizer 51C illustrated in (a) of FIG. 10, peeling off the non-flexible first support substrate 20 from the resin layer 21, and attaching the second flexible substrate 32 to the surface of the resin layer 21 from which the non-flexible first support substrate 20 is peeled off via the adhesive layer 31.

As illustrated in (c) of FIG. 10, in the step of full cut FC and half cut HC of the flexible display element substrate 60B provided with the circular polarizer 51C, the full cut FC and the half cut HC are performed so as to pass through the portion where the water repellent layer 7A is present. The flexible display element substrate 60B provided with the circular polarizer 51C, which is the display element assembly substrate including the plurality of display regions DA, becomes a flexible display element substrate 60B' provided with a singulated circular polarizer 51C including, for example, one display region DA and the terminal portion EP illustrated in (a) of FIG. 11, by the full cut FC.

The terminal portion EP illustrated in (b) of FIG. 11 is exposed, and the flexible display element substrate 60C provided with the circular polarizer not including the first film 9 is obtained by peeling off the half cut HC portion and peeling off the adhesive layer 8 and the first film 9.

(c) of FIG. 11 is a top view of the flexible display element substrate 60C illustrated in (b) of FIG. 11, where the overcoat layer 6 is exposed from the opening of the water repellent layer 7A, and the water repellent layer 7A overlaps with at least the end portion of the overcoat layer 6.

The flexible display device 60D illustrated in (d) FIG. 11 is obtained by attaching the first housing 34 via the adhesive layer 33 from the overcoat layer 6 and the water repellent layer 7A forming surface side.

Figure 12:
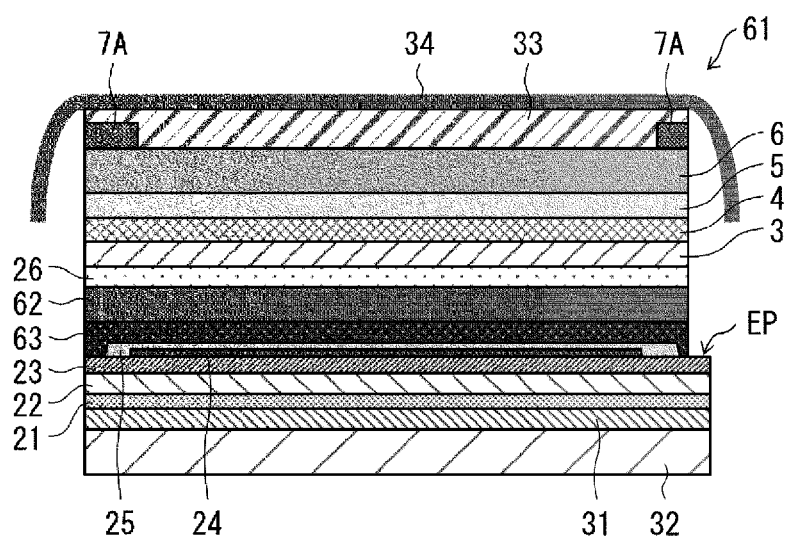
FIG. 12 is a diagram illustrating a schematic configuration of a flexible display device which is a modified example of the second embodiment provided with a touch panel.

FIG. 12 is a diagram illustrating a schematic configuration of a flexible display device 61 provided with a touch panel substrate 62.

The flexible display device 61 illustrated in FIG. 12 is the same as the flexible display device 60D illustrated in (d) of FIG. 11, except that the flexible display device 61 is provided with a touch panel substrate 62 and an adhesive layer 63.

The touch panel substrate 62 is preferably provided between the sealing layer 25 and the $\lambda/4$ layer 4, which is a phase difference plate, from the perspective of being able to suppress reflection of the touch panel substrate, and touch panel substrate 62 is provided between the first flexible substrate 3 and the sealing layer 25 by using the adhesive layer 63 and the adhesive layer 26 in the flexible display device 61. As the adhesive layer 63, for example, an Optical Clear Adhesive (OCA) or an Optical Clear Resin (OCR) is preferably used.

Note that the flexible display device 61 provided with the touch panel substrate 62 described above is an example, and this is not restrictive, and a touch panel may be provided as, for example, an on-cell touch panel on the sealing layer 25. A touch panel may be formed between the sealing layer 25 and the first housing 34, for example, and, in a case where the touch panel is formed between the sealing layer 25 and the first housing 34, a touch panel may be formed on, for example, a transparent polyimide as a support body. In addition, a film-shaped touch panel may be purchased from a touch panel manufacturer and attached via an adhesive layer between the sealing layer 25 and the first housing 34.

Third Embodiment

Next, a third embodiment according to the disclosure will be described with reference to FIG. 13 to FIG. 15. A flexible display device 71D according to the present embodiment is different from the first and second embodiments in that the flexible display device 71D uses a film-shaped water repellent layer 7B. Other configurations are the same as those described in the first and second embodiments. For the sake of the description, members having the same functions as the members illustrated in the diagrams in the first and second embodiments are denoted by the same reference numerals, and descriptions thereof will be omitted.

Figure 13:
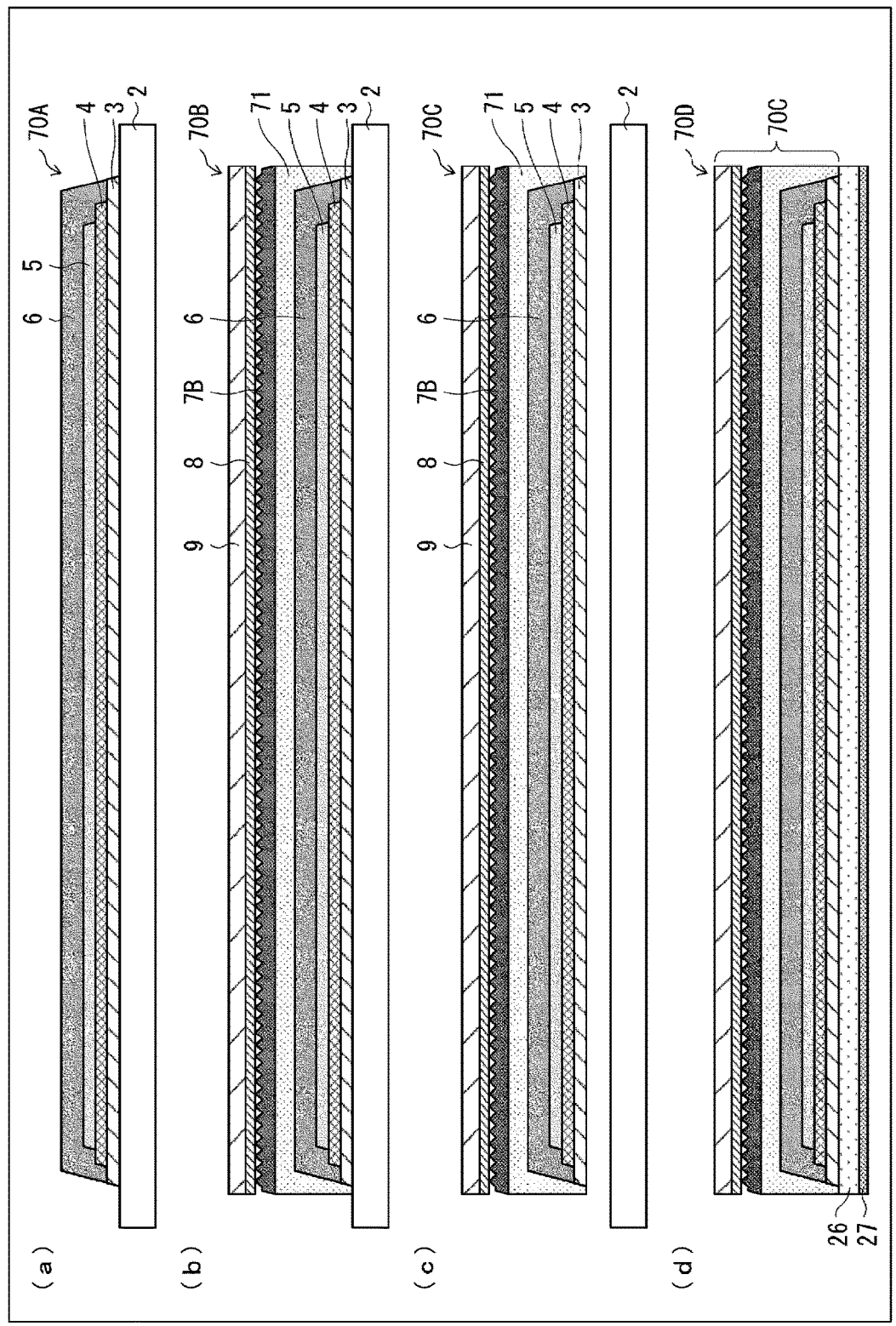
FIGS. 13(a) to 13(d) are diagrams for explaining a step of forming a circular polarizer provided in a flexible display device according to a third embodiment.

(a) of FIG. 13 to (d) of FIG. 13 are diagrams for explaining a step of forming a flexible circular polarizer 70C.

In the non-flexible circular polarizer 70B illustrated in (b) of FIG. 13, the water repellent layer 7B having a moth-eye structure is provided on the overcoat layer 6 of the non-flexible circular polarizer 70A illustrated in (a) of FIG. 13 via the adhesive layer 71. In the present embodiment, description is given by taking, as an example, a case in which a super water repellent moth-eye film is used as the film-shaped water repellent layer 7B. However, this is not restrictive, and a flat water repellent film may be used as the film-shaped water repellent layer 7B, or a water repellent film having a fine concave-convex structure may be used.

Note that in the present embodiment, a super water repellent moth-eye film as disclosed in International Publication (WO 2016/174893 A1) was used as the super water repellent moth-eye film.

As the adhesive layer 71, for example, an Optical Clear Adhesive (OCA) or an Optical Clear Resin (OCR) is preferably used. Note that in the present embodiment, in a case where the adhesive layer 71 is provided directly on the linear polarizer 5 including the lyotropic liquid crystal, the adhesive layer 71 may adversely affect the linear polarizer 5 including the lyotropic liquid crystal. Thus, the overcoat layer 6 is provided on the linear polarizer 5 including the lyotropic liquid crystal, and the adhesive layer 71 is formed on the overcoat layer 6. However, this is not restrictive, and in a case where the film-shaped water repellent layer 7B is used, the overcoat layer 6 may be omitted as appropriate in a case where the adhesive layer 71 does not adversely affect the linear polarizer 5 including the lyotropic liquid crystal.

Note that, in the present embodiment, a film including a moth-eye structure used as the film-shaped water repellent layer 7B means an optical film including a cured resin layer having a concave-convex structure on a surface thereof. In the concave-convex structure, the plurality of protruding portions have a pitch equal to or lower than the wavelength of visible light (visible light wavelength; in the range of approximately 380 to 800 nm), the cured resin layer includes fluorine atoms, and the height of the protruding portions is approximately 200 to 300 nm. Note that the contact angle of the film including the moth-eye structure with water is 100° or greater.

The flexible circular polarizer 70C illustrated in (c) of FIG. 13 is obtained by irradiating the first flexible substrate 3 with laser light via the non-flexible second support substrate 2, and peeling off the non-flexible second support substrate 2 from the first flexible substrate 3.

The flexible circular polarizer 70D illustrated in (d) of FIG. 13 is obtained by forming the adhesive layer 26 on the surface of the first flexible substrate 3 of the flexible circular polarizer 70C illustrated in (c) of FIG. 13 from which the non-flexible second support substrate 2 is peeled off, and then attaching the second film 27 that protects the adhesive layer 26.

Figure 14:
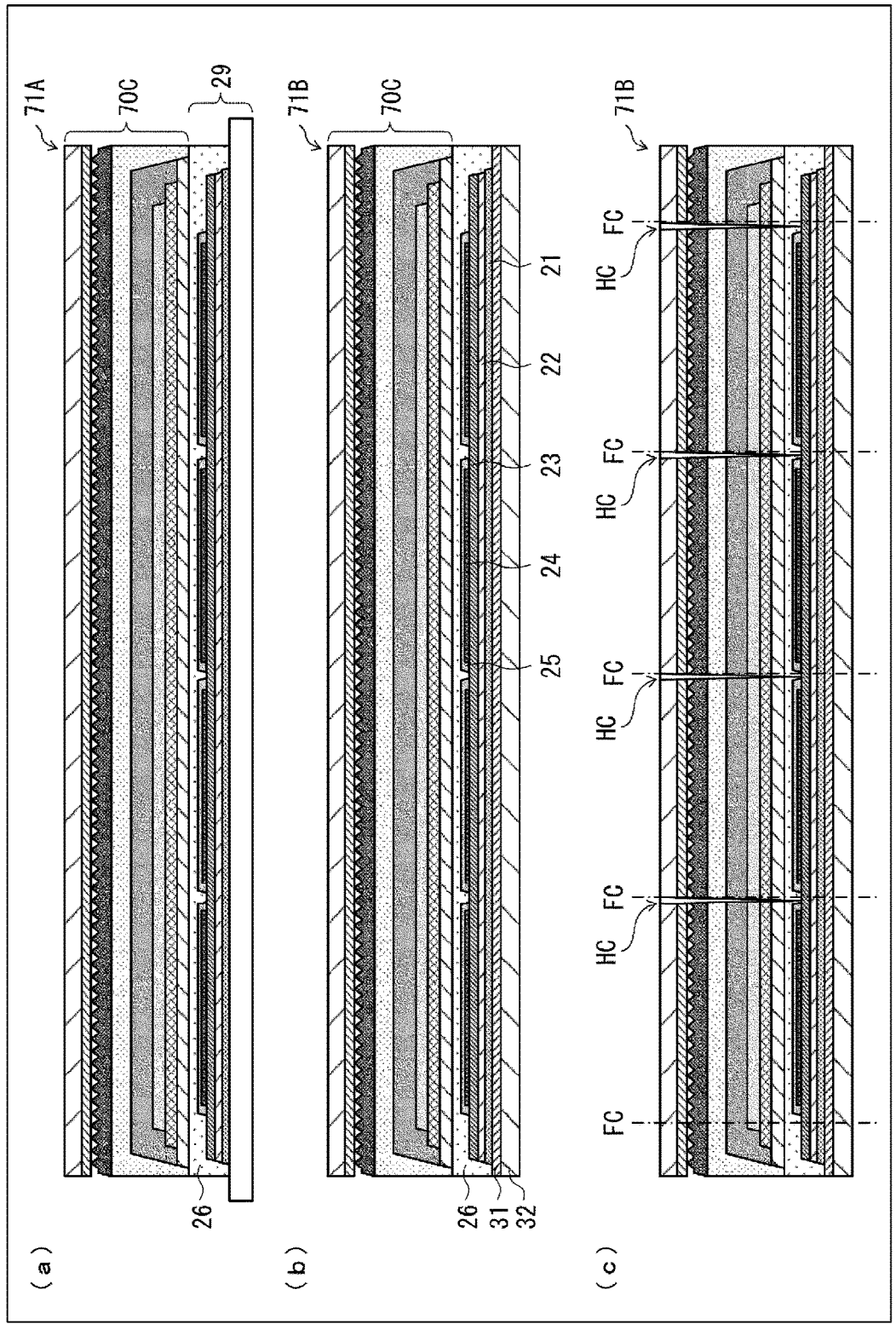
FIGS. 14(a) to 14(c) are diagrams illustrating a part of a manufacturing process of the flexible display device according to the third embodiment.
Figure 15:
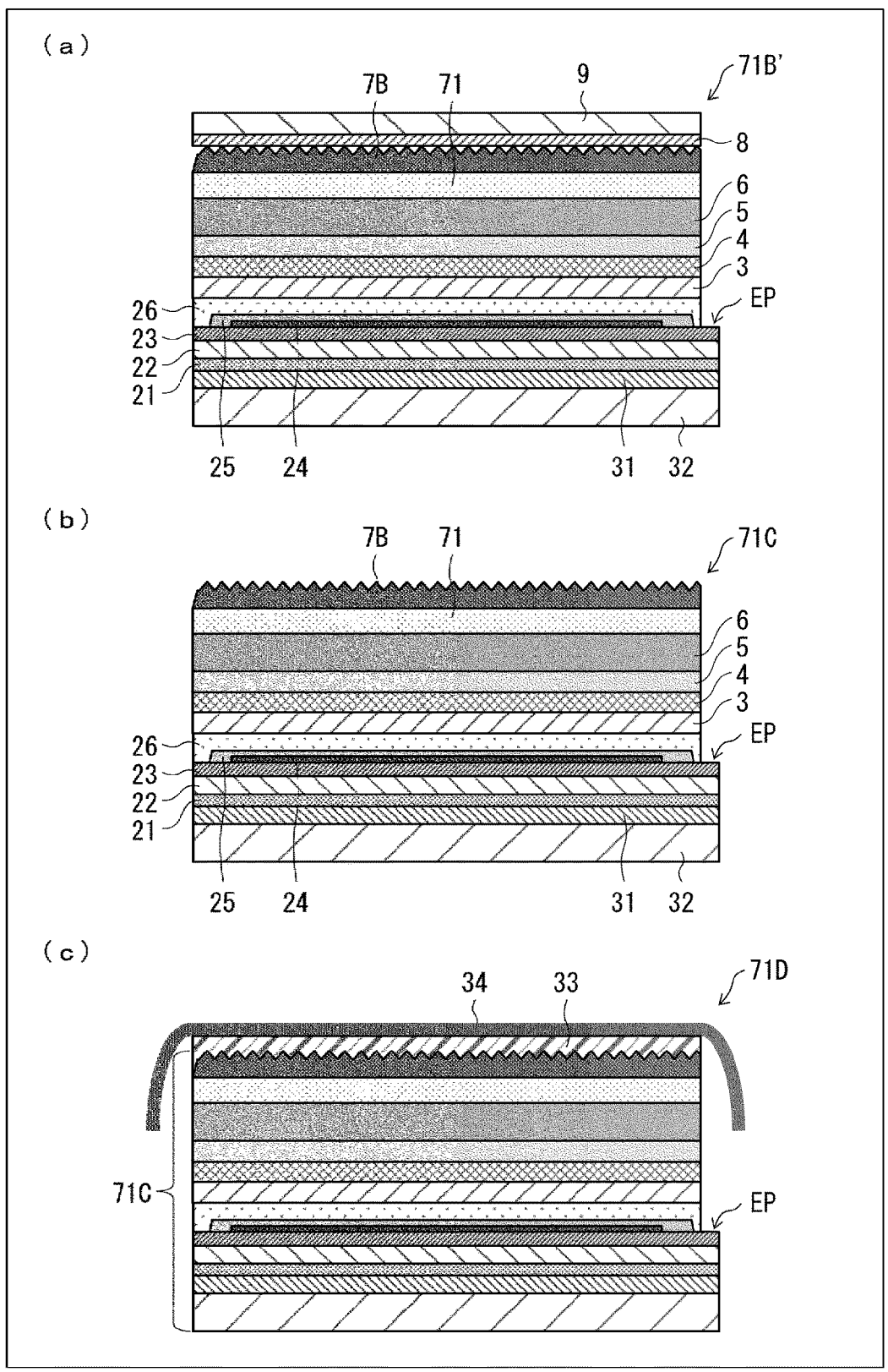
FIGS. 15(a) to 15(c) are diagrams illustrating the remaining part of the manufacturing process of the flexible display device according to the third embodiment.

(a) of FIG. 14 to (c) of FIG. 14 and (a) of FIG. 15 to (c) of FIG. 15 are diagrams for explaining a manufacturing process of a flexible display device 71D.

The non-flexible display element substrate 71A provided with the circular polarizer 70C illustrated in (a) of FIG. 14 can be obtained by bonding the flexible circular polarizer 70C illustrated in (c) of FIG. 13 and (d) of FIG. 13 on the sealing layer 25 of the non-flexible display element substrate 29 illustrated in (d) of FIG. 2 via the adhesive layer 26.

The flexible display element substrate 71B provided with the circular polarizer 70C illustrated in (b) of FIG. 14 can be obtained by irradiating the resin layer 21 with laser light via the non-flexible first support substrate 20 in the non-flexible display element substrate 71A provided with the circular polarizer 70C illustrated in (a) of FIG. 14, peeling off the non-flexible first support substrate 20 from the resin layer 21, and attaching the second flexible substrate 32 to the surface of the resin layer 21 from which the non-flexible first support substrate 20 is peeled off, via an adhesive layer 31.

As illustrated in (c) of FIG. 14, in the step of full cut FC and half cut HC of the flexible display element substrate 71B provided with the circular polarizer 70C, the full cut FC and the half cut HC are performed. The flexible display element substrate 71B provided with the circular polarizer 70C, which is the display element assembly substrate including the plurality of display regions DA, becomes a flexible display element substrate 71B' provided with a singulated circular polarizer 70C including, for example, one display region DA and the terminal portion EP illustrated in (a) of FIG. 15, by the full cut FC. Note that in the flexible display element substrate 71B', the half cut HC portion is peeled off, and the terminal portion EP is exposed.

The terminal portion EP illustrated in (b) of FIG. 15 is exposed, and the flexible display element substrate 71C provided with the circular polarizer not including the first film 9 is obtained by peeling off the adhesive layer 8 and the first film 9.

The flexible display device 71D illustrated in (c) FIG. 15 is obtained by attaching the first housing 34 via the adhesive layer 33 from the water repellent layer 7B forming surface side.

Note that in the present embodiment, the first housing 34 is attached to the water repellent layer 7B via the adhesive layer 33, but this is not restrictive. In a case where water repellency is expressed by a fine concave-convex structure, such as a water repellent layer having a moth-eye structure, the antireflective effect by the fine concave-convex structure can be expected, so the first housing 34 may only be placed directly over the water repellent layer 7B without using the adhesive layer 33. In this way, it is possible to reduce the risk of defects occurring during attachment, and it is expected that the yield will be improved.

In the present embodiment, the film-shaped water repellent layer 7B is provided on the entire surface of the overcoat layer 6 as one continuous layer. However, this is not restrictive, and as in the second embodiment, the film-shaped water repellent layer 7B may have a plurality of openings as long as the film-shaped water repellent layer 7B overlaps with at least the end portion of the overcoat layer provided on the flexible display device that is singulated after the partitioning step.

Fourth Embodiment

Next, a fourth embodiment according to the disclosure will be described with reference to FIG. 16 to FIG. 19. A flexible display device 80D according to the present embodiment is different from the first to third embodiments in that the flexible display device 80D uses a third flexible substrate 77 provided with a first film 9 and a water repellent layer 7C. Other configurations are the same as those described in the first to third embodiments. For convenience of description, members having the same functions as those of the members illustrated in the drawings in the first to third embodiments are denoted by the same reference numerals, and descriptions thereof will be omitted.

Figure 16:
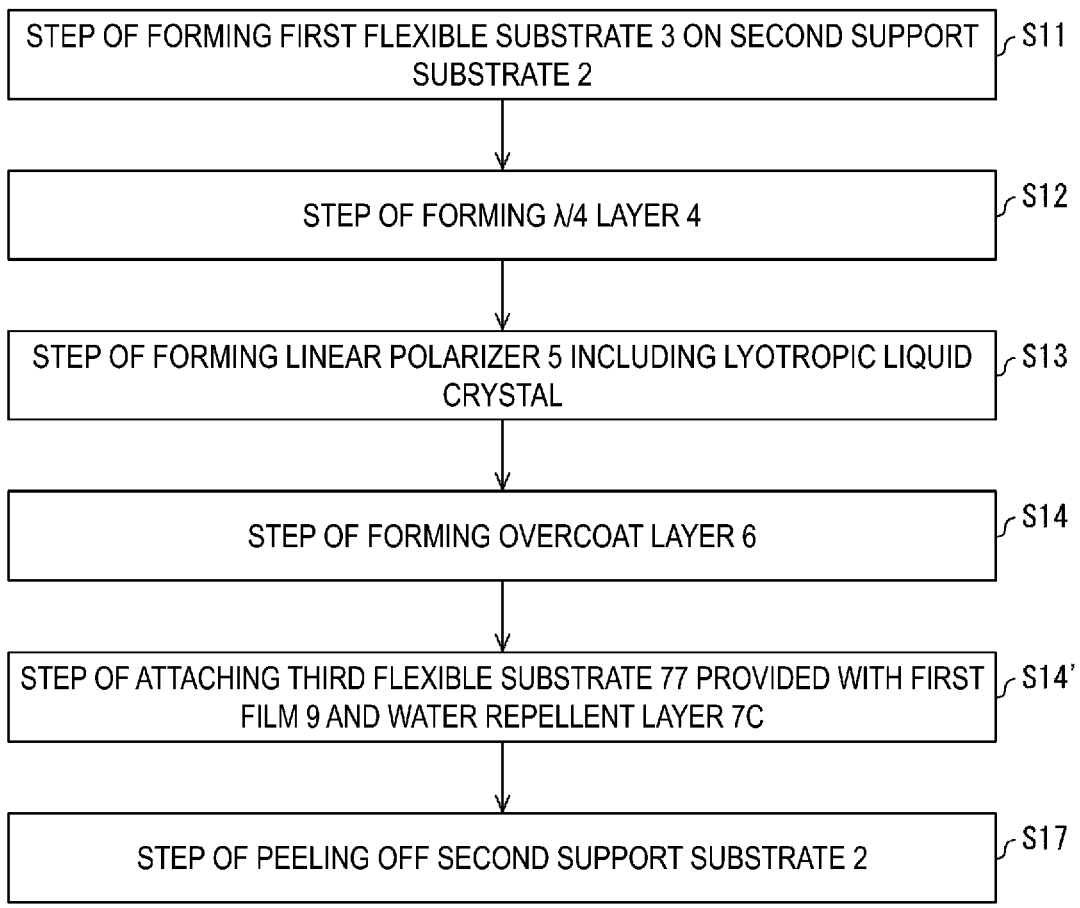
FIG. 16 is a diagram explaining a step of forming a circular polarizer provided in a flexible display device according to a fourth embodiment.
Figure 17:
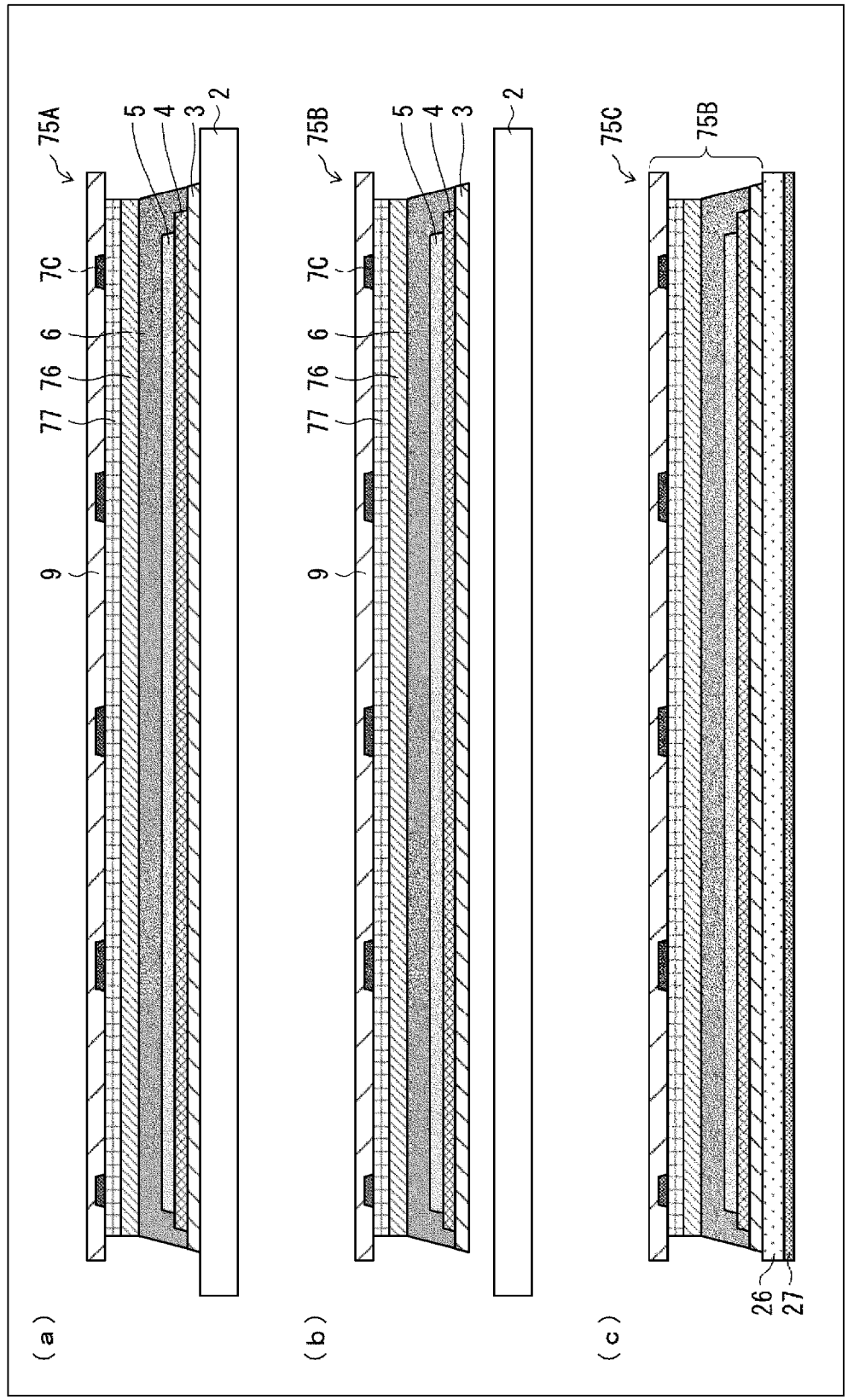
FIGS. 17(a) to 17(c) are diagrams for explaining a step of forming a circular polarizer provided in a flexible display device according to the fourth embodiment.

FIG. 16 and (a) of FIG. 17 to (c) of FIG. 17 are diagrams for explaining a step of forming a flexible circular polarizer 75B.

As illustrated in FIG. 16, in the step of forming the flexible circular polarizer 75B, a step (S14') of attaching a third flexible substrate 77 provided with a first film 9 and a water repellent layer 7C is included between the overcoat layer forming step (S14) of forming the overcoat layer 6 and the non-flexible second support substrate peeling step (S17) of peeling off the non-flexible second support substrate 2 from the first flexible substrate 3. The step of attaching the third flexible substrate 77 provided with the first film 9 and the water repellent layer 7C includes the step (S15) of forming the water repellent layer illustrated in FIG. 3 and the step (S16) of attaching the first film 9, and the first film 9 may not be provided if not required.

In the non-flexible circular polarizer 75A illustrated in (a) of FIG. 17, the third flexible substrate 77 provided with the first film 9 and the water repellent layer 7C is provided on the overcoat layer 6 via the adhesive layer 76.

As the adhesive layer 76, for example, an Optical Clear Adhesive (OCA) or an Optical Clear Resin (OCR) is preferably used. Note that in the present embodiment, in a case where the adhesive layer 76 is provided directly on the linear polarizer 5 including the lyotropic liquid crystal, the adhesive layer 76 may adversely affect the linear polarizer 5 including the lyotropic liquid crystal. Thus, the overcoat layer 6 is provided on the linear polarizer 5 including the lyotropic liquid crystal, and the adhesive layer 76 is formed on the overcoat layer 6. However, this is not restrictive, and in a case where the third flexible substrate 77 provided with the first film 9 and the water repellent layer 7C is used, the overcoat layer 6 may be omitted as appropriate in a case where the adhesive layer 76 does not adversely affect the linear polarizer 5 including the lyotropic liquid crystal.

The flexible circular polarizer 75B illustrated in (b) of FIG. 17 is obtained by irradiating the first flexible substrate 3 with laser light via the non-flexible second support substrate 2, and peeling off the non-flexible second support substrate 2 from the first flexible substrate 3.

The flexible circular polarizer 75C illustrated in (c) of FIG. 17 is obtained by forming the adhesive layer 26 on the surface of the first flexible substrate 3 of the flexible circular polarizer 75B illustrated in (b) of FIG. 17 from which the non-flexible second support substrate 2 is peeled off, and then attaching the second film 27 that protects the adhesive layer 26.

Figure 18:
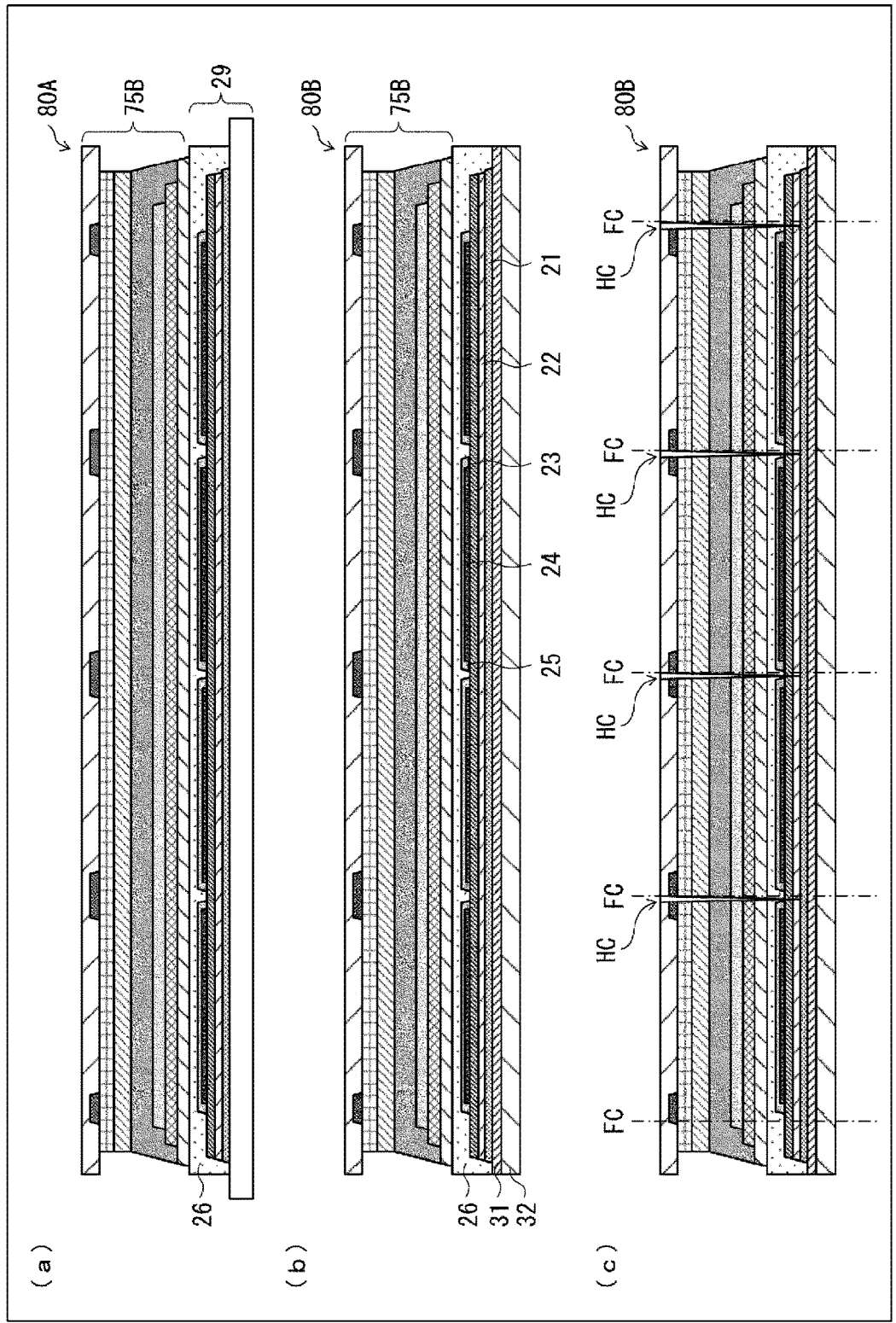
FIGS. 18(a) to 18(c) are diagrams illustrating a part of a manufacturing process of the flexible display device according to the fourth embodiment.
Figure 19:
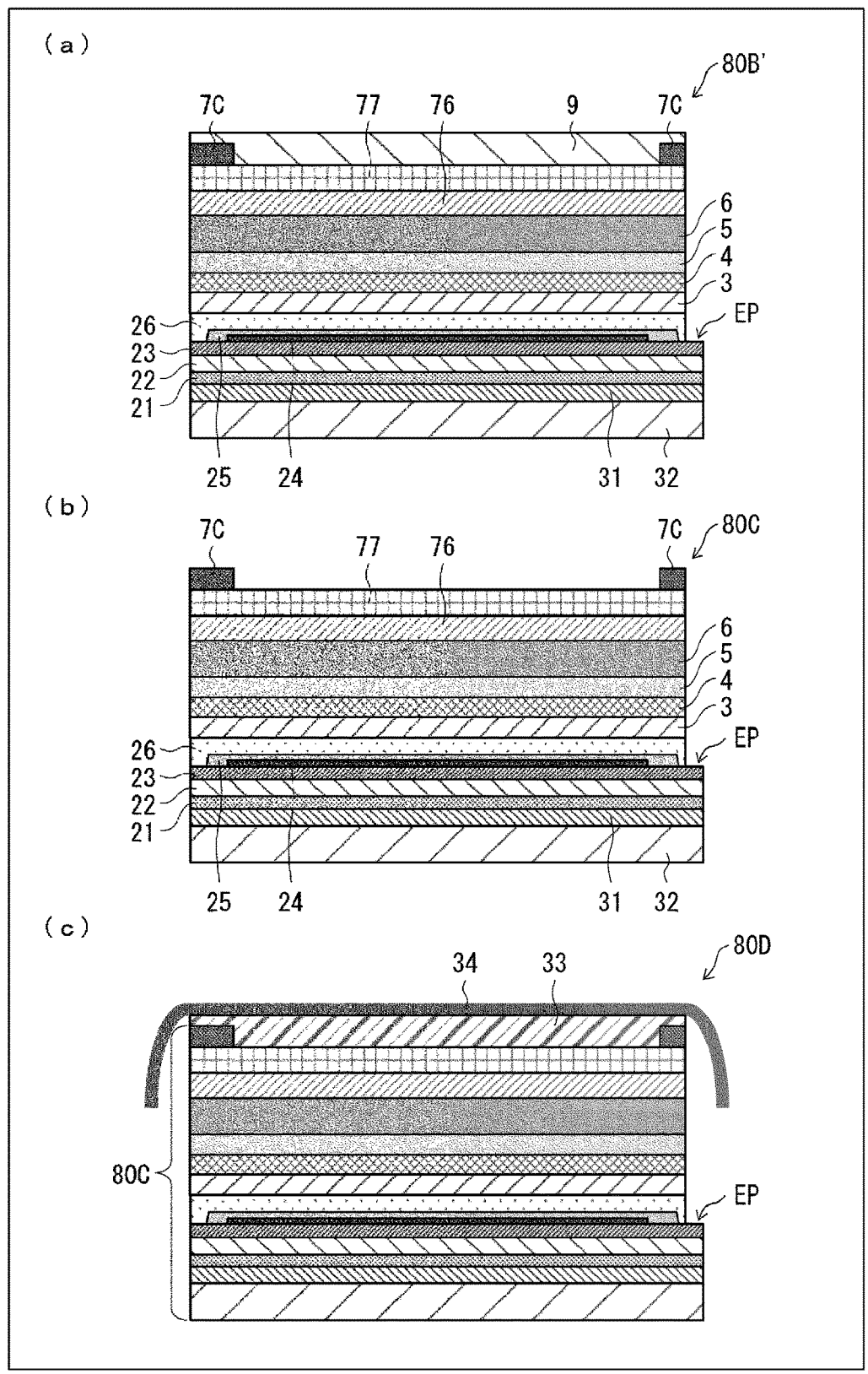
FIGS. 19(a) to 19(c) are diagrams illustrating the remaining part of the manufacturing process of the flexible display device according to the fourth embodiment.

(a) of FIG. 18 to (c) of FIG. 18 and (a) of FIG. 19 to (c) of FIG. 19 are diagrams for explaining a manufacturing process of a flexible display device 80D.

The non-flexible display element substrate 80A provided with the circular polarizer 75B illustrated in (a) of FIG. 18 can be obtained by bonding the flexible circular polarizer 75B illustrated in (b) of FIG. 17 and (c) of FIG. 17 on the sealing layer 25 of the non-flexible display element substrate 29 illustrated in (d) of FIG. 2, via the adhesive layer 26.

The flexible display element substrate 80B provided with the circular polarizer 75B illustrated in (b) of FIG. 18 can be obtained by irradiating the resin layer 21 with laser light via the non-flexible first support substrate 20 in the non-flexible display element substrate 80A provided with the circular polarizer 75B illustrated in (a) of FIG. 18, peeling off the non-flexible first support substrate 20 from the resin layer 21, and attaching the second flexible substrate 32 to the surface of the resin layer 21 from which the non-flexible first support substrate 20 is peeled off via the adhesive layer 31.

As illustrated in (c) of FIG. 18, in the step of full cut FC and half cut HC of the flexible display element substrate 80B provided with the circular polarizer 75B, the full cut FC and the half cut HC are performed. The flexible display element substrate 80B provided with the circular polarizer 75B, which is the display element assembly substrate including the plurality of display regions DA, becomes a flexible display element substrate 80B' provided with a singulated circular polarizer 75B including, for example, one display region DA and the terminal portion EP illustrated in (a) of FIG. 19, by the full cut FC. Note that in the flexible display element substrate 80B', the half cut HC portion is peeled off, and the terminal portion EP is exposed.

The terminal portion EP illustrated in (b) of FIG. 19 is exposed, and the flexible display element substrate 80C provided with the circular polarizer not including the first film 9 is obtained by peeling off the first film 9.

The flexible display device 80D illustrated in (c) FIG. 19 is obtained by attaching the first housing 34 via the adhesive layer 33 from the water repellent layer 7C and the third flexible substrate 77 forming surface side.

In the present embodiment, the third flexible substrate 77 provided with the water repellent layer 7C is a film partially having water repellency. Note that in a case where the water repellent layer 7C has a fine concave-convex structure such as a moth-eye structure, the third flexible substrate 77 provided with the water repellent layer 7C can be fabricated by using a mold having a fine concave-convex structure in that portion. Note that, in the third flexible substrate 77 provided with the water repellent layer 7C, masking is performed other than the water repellent layer 7C having the concave-convex structure in forming the water repellent layer 7C having the concave-convex structure by anode oxidation/etching.

Fifth Embodiment

Next, a fifth embodiment according to the disclosure will be described with reference to FIG. 20 to FIG. 23. The flexible display device 85D according to the present embodiment is different from the first to fourth embodiments in that the flexible display device 85D is prepared by each of the non-flexible display element substrate 29 and the circular polarizer 1B first being partitioned and then bonded together. Other configurations are the same as those described in the first to fourth embodiments. For convenience of description, members having the same functions as those of the members illustrated in the drawings in the first to fourth embodiments are denoted by the same reference numerals, and descriptions thereof will be omitted.

Figure 20:
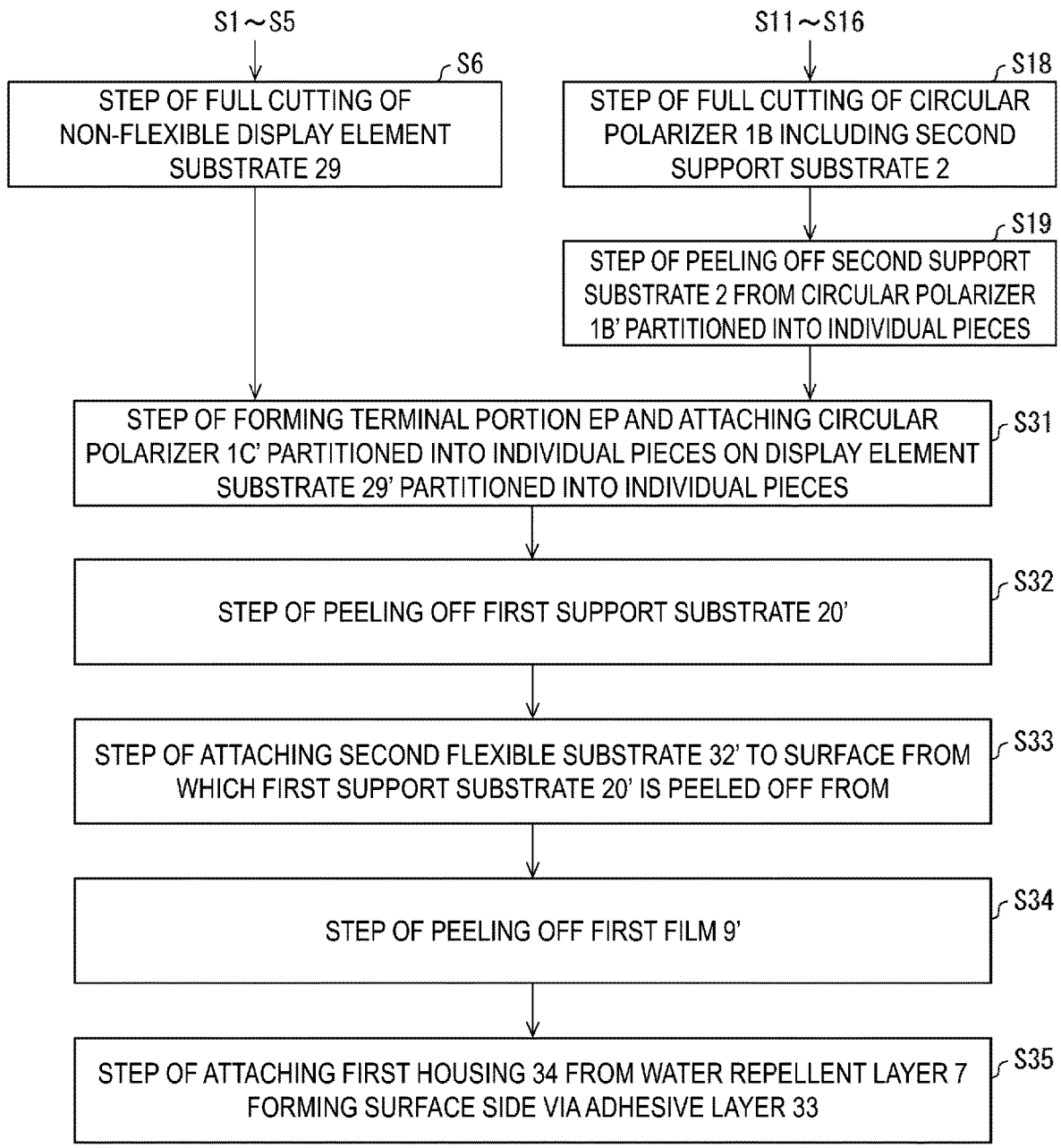
FIG. 20 is a diagram for explaining a manufacturing process of a flexible display device according to a fifth embodiment.
Figure 21:
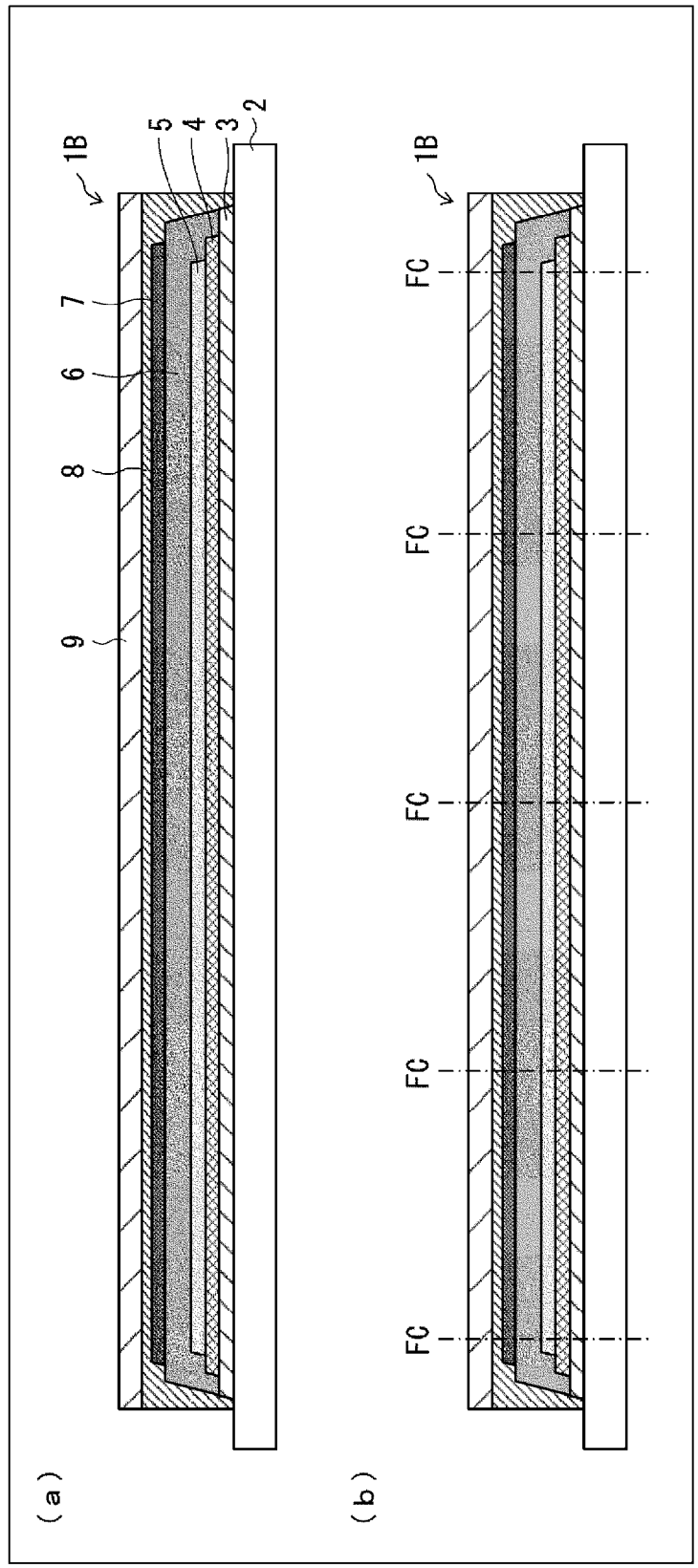
FIGS. 21(a) and 21(b) are diagrams for explaining a step of forming a circular polarizer used in the manufacturing process of the flexible display device according to the fifth embodiment.
Figure 22:
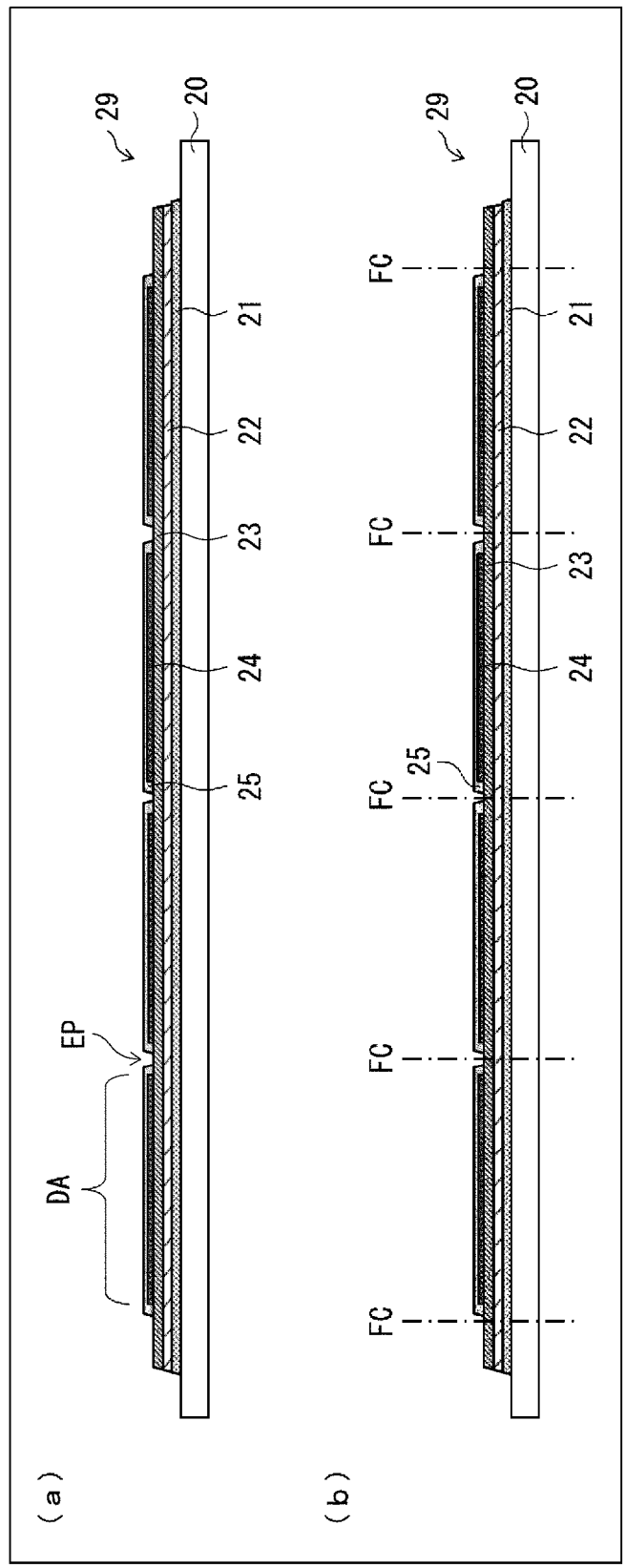
FIGS. 22(a) and 22(b) are diagrams for explaining a step of forming a non-flexible display element substrate used in the manufacturing process of the flexible display device according to the fifth embodiment.
Figure 23:
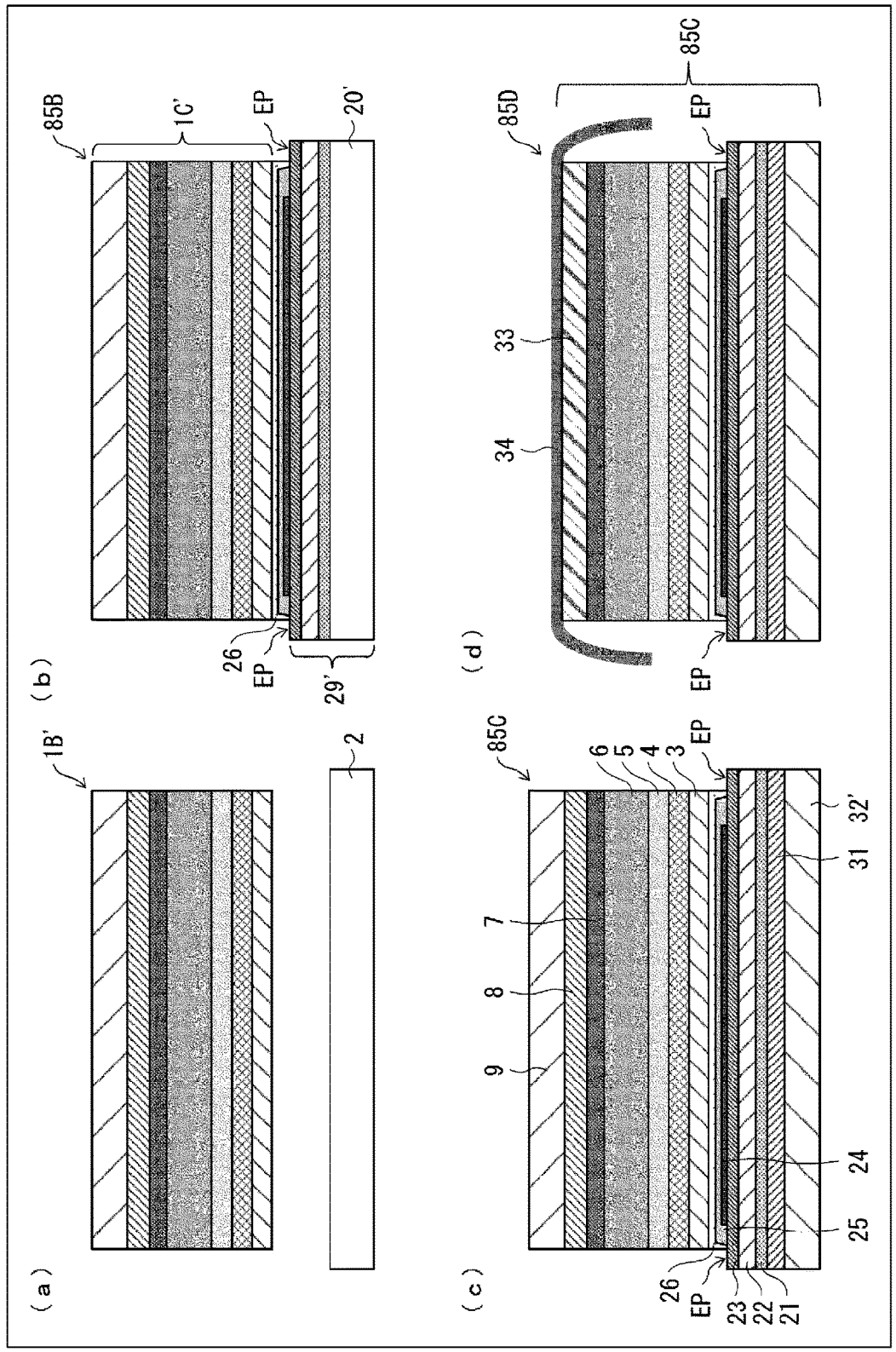
FIG. 23 is a diagram illustrating a part of the manufacturing process of the flexible display device according to the fifth embodiment.
Figure 25:
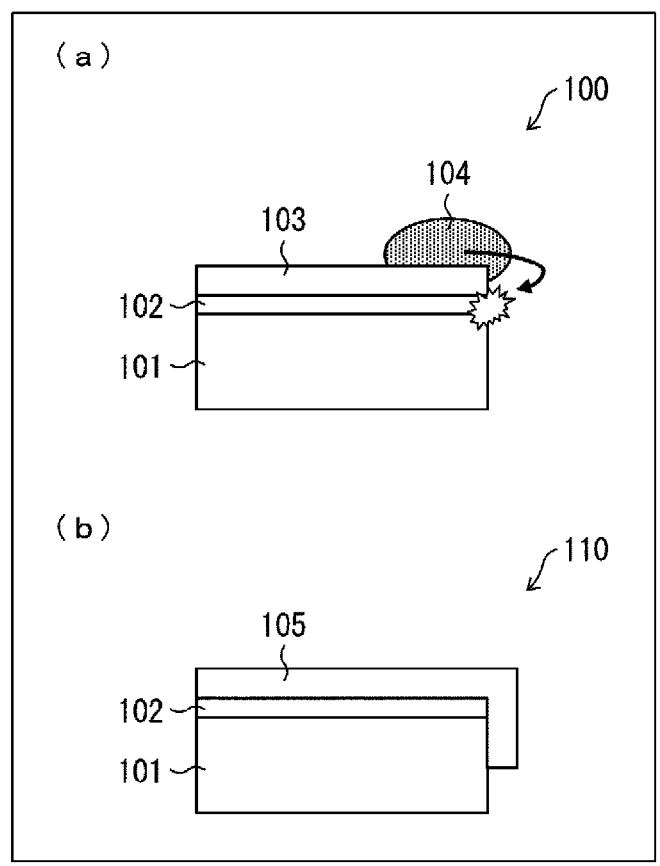
FIG. 25(a) is a diagram illustrating a schematic configuration of a known display device provided with an overcoat material.
FIG. 25(b) is a diagram illustrating a schematic configuration of a known display device provided with an overcoat material on a cut surface.

FIG. 20, (a) of FIG. 21 to (b) of FIG. 21, (a) of FIG. 22 to (b) of FIG. 22, and (a) of FIG. 23 to (d) of FIG. 23 are diagrams for explaining a manufacturing process of a flexible display device 85D.

As illustrated in FIG. 20, in the manufacturing process of the flexible display device 85D, before the step (S31) of forming the terminal portion EP and attaching the circular polarizer 1C' partitioned into individual pieces to the display element substrate 29' partitioned into individual pieces, a step (S6) of full cutting of the non-flexible display element substrate 29, a step (S18) of full cutting of the circular polarizer 1B including the second support substrate 2, and a step (S19) of peeling off the second support substrate 2 from the circular polarizer 1B' partitioned into individual pieces are performed. Furthermore, the manufacturing process of the flexible display device 85D includes a step (S32) of peeling off the first support substrate 20' partitioned into individual pieces, a step (S33) of attaching the second flexible substrate 32' to the surface from which the first support substrate 20' is peeled off, a step (S34) of peeling off the first film 9', and a step (S35) of attaching the first housing 34 from the water repellent layer 7 forming surface side via the adhesive layer 33.

In the step (S18) of full cutting of the circular polarizer 1B including the second support substrate 2 illustrated in (a) of FIG. 21 and (b) of FIG. 21, the circular polarizer 1B is full cut FC.

In the step (S6) of full cutting of the non-flexible display element substrate 29 illustrated in (a) of FIG. 22 and (b) of FIG. 22, the non-flexible display element substrate 29 is full cut FC.

(a) of FIG. 23 illustrates the step (S19) of peeling off the second support substrate 2 from the circular polarizer 1B' partitioned into individual pieces.

In the step (S31) of forming the terminal portion EP and attaching the circular polarizer 1C' partitioned into individual pieces on the display element substrate 29' partitioned into individual pieces illustrated in (b) of FIG. 23, the non-flexible display element substrate 85B provided with the circular polarizer 1C' can be obtained.

In the step (S32) of peeling off the first support substrate 20' partitioned into individual pieces and the step (S33) of attaching the second flexible substrate 32' to the surface from which the first support substrate 20' is peeled off as illustrated in (c) of FIG. 23, the flexible display element substrate 85C provided with the circular polarizer 1C' can be obtained.

In the step (S34) of peeling off the first film 9' and the step (S35) of attaching the first housing 34 via the adhesive layer 33 from the water repellent layer 7 forming surface side as illustrated in (d) of FIG. 23, the flexible display device 85D can be obtained.

In a case where it is difficult to perform half cut or full cut after bonding the display element substrate and the circular polarizer, it is preferable that each of the display element substrate and the circular polarizer is partitioned first and then bonded together as described above, to prepare a flexible display device.

Supplement

First Aspect

A flexible display device including a transistor layer, a light-emitting element layer, and a sealing layer, the flexible display device further including:
  a first flexible substrate;
  a second flexible substrate;
  a phase difference plate;
  a linear polarizer including a lyotropic liquid crystal;
  an overcoat layer; and
  a water repellent layer,
  wherein the transistor layer, the light-emitting element layer, the sealing layer, the first flexible substrate, the phase difference plate, the linear polarizer, the overcoat layer, and the water repellent layer are provided in this order on the second flexible substrate, and
  the water repellent layer is provided to overlap with at least an end portion of the overcoat layer.

Second Aspect

The flexible display device according to aspect 1,
  wherein the water repellent layer is provided on an entire surface of the overcoat layer.

Third Aspect

The flexible display device according to aspect 1 or 2,
  wherein the water repellent layer has a contact angle with water of 62 degrees or greater.

Fourth Aspect

The flexible display device according to aspect 3,
  wherein the water repellent layer has a contact angle with water of 103 degrees or greater.

Fifth Aspect

The flexible display device according to any one of aspects 1 to 4,
wherein the water repellent layer includes a moth-eye structure.

Sixth Aspect

The flexible display device according to any one of aspects 1 to 5,
wherein the lyotropic liquid crystal is a lyotropic chromonic liquid crystal.

Seventh Aspect

The flexible display device according to any one of aspects 1 to 6, further including a touch panel substrate,
wherein the touch panel substrate is provided between the sealing layer and the phase difference plate.

Eighth Aspect

The flexible display device according to any one of aspects 1 to 7,
wherein a thickness of the linear polarizer is not less than 0.1 µm and not greater than 1 µm.

Ninth Aspect

The flexible display device according to any one of aspects 1 to 8,
wherein a display region including the light-emitting element layer, a frame region surrounding the display region, and a terminal portion on one end of the frame region are provided on the second flexible substrate.

Tenth Aspect

The flexible display device according to aspect 9,
wherein the second flexible substrate includes four sides, and end portions of the second flexible substrate, the transistor layer, the first flexible substrate, the phase difference plate, the linear polarizer, the overcoat layer, and the water repellent layer are provided in alignment to each other at a side other than a side provided with the terminal portion among the four sides,
end portions of the first flexible substrate, the phase difference plate, the linear polarizer, the overcoat layer, and the water repellent layer are provided in alignment to each other between the terminal portion and the display region, and
the terminal portion is provided on one end of the transistor layer exposed from the sealing layer, the first flexible substrate, the phase difference plate, the linear polarizer, the overcoat layer, and the water repellent layer.

Eleventh Aspect

A foldable display device including:
the flexible display device according to aspect 9 or 10;
a first non-flexible support substrate supporting a first display region being part of the display region of the flexible display device; and
a second non-flexible support substrate supporting a second display region being another part of the display region of the flexible display device,
wherein a third display region being still another part of the display region of the flexible display device is between the first display region and the second display region, and overlaps with a gap between the first non-flexible support substrate and the second non-flexible support substrate, and
the flexible display device is bent in the third display region.

Twelfth Aspect

The foldable display device according to aspect 11,
wherein the first non-flexible support substrate includes four sides, and end portions of the second flexible substrate, the transistor layer, the first flexible substrate, the phase difference plate, the linear polarizer, the overcoat layer, and the water repellent layer are provided in alignment to each other at a side or inside of the side other than a side in contact with the gap among the four sides,
the second non-flexible support substrate includes four sides, and end portions of the second flexible substrate, the transistor layer, the first flexible substrate, the phase difference plate, the linear polarizer, the overcoat layer, and the water repellent layer are provided in alignment to each other at two sides or inside of the two sides other than a side in contact with the gap and a side closer to the terminal portion among the four sides, and
end portions of the first flexible substrate, the phase difference plate, the linear polarizer, the overcoat layer, and the water repellent layer are provided in alignment to each other between the terminal portion and the display region at the side closer to the terminal portion among the four sides of the second non-flexible support substrate.

Thirteenth Aspect

The foldable display device according to aspect 12,
wherein the terminal portion is provided on a surface of the second non-flexible support substrate on a side opposite to a surface provided with the flexible display device.

Fourteenth Aspect

A method for manufacturing a flexible display device, the method including:
forming a non-flexible display element substrate including forming a resin layer on a non-flexible first support substrate, forming a barrier layer on the resin layer, forming a transistor layer on the barrier layer, forming a light-emitting element layer on the transistor layer, and forming a sealing layer on the light-emitting element layer;
forming a circular polarizer including forming a first flexible substrate on a non-flexible second support substrate, forming a linear polarizer including a lyotropic liquid crystal on the first flexible substrate, forming an overcoat layer on the linear polarizer, forming a water repellent layer on the overcoat layer, and peeling off the non-flexible second support substrate from the first flexible substrate; and forming a flexible display element provided with a circular polarizer including attaching the circular polarizer to the sealing layer of the non-flexible display element substrate via an adhesive layer and peeling off the non-flexible first support substrate from the resin layer of the non-flexible display element substrate.

Fifteenth Aspect

The method for manufacturing a flexible display device according to aspect 14,
wherein the forming the flexible display element provided with the circular polarizer further includes attaching a second flexible substrate to a surface of the resin layer from which the non-flexible first support substrate is peeled off from, after the peeling off the non-flexible first support substrate.

Sixteenth Aspect

The method for manufacturing a flexible display device according to aspect 15,
wherein the forming the circular polarizer further includes attaching a film to the water repellent layer, between the forming the water repellent layer and the peeling off the non-flexible second support substrate, and
the forming the flexible display element provided with the circular polarizer further includes peeling off the film, after the attaching the second flexible substrate.

Seventeenth Aspect

The method for manufacturing a flexible display device according to any one of aspects 14 to 16,
wherein the non-flexible display element substrate is a display element assembly substrate including a plurality of display regions.

Eighteenth Aspect

The method for manufacturing a flexible display device according to any one of aspects 14 to 16,
wherein the forming the non-flexible display element substrate further includes singulating the display element assembly substrate including the plurality of display regions into the plurality of individual display regions, and
the non-flexible display element substrate is a display element substrate including one display region.

Nineteenth Aspect

The method for manufacturing a flexible display device according to any one of aspects 14 to 18,
wherein the forming the water repellent layer in the forming the circular polarizer further includes applying a water repellent material.

Twentieth Aspect

The method for manufacturing a flexible display device according to any one of aspects 14 to 18,
wherein in the forming the water repellent layer in the forming the circular polarizer, the water repellent layer having a film shape is attached to the overcoat layer.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a flexible display device, a method for manufacturing a flexible display device, and a foldable display device.

The invention claimed is:

1. A flexible display device including a transistor layer, a light-emitting element layer, and a sealing layer, the flexible display device further comprising:
a first flexible substrate:
a second flexible substrate;
a phase difference plate;
a linear polarizer including a lyotropic liquid crystal;
an overcoat layer; and
a water repellent layer,
wherein the transistor layer, the light-emitting element layer, the sealing layer, the first flexible substrate, the phase difference plate, the linear polarizer, the overcoat layer, and the water repellent layer are provided in this order on the second flexible substrate, and
the water repellent layer is provided to overlap with at least an end portion of the overcoat layer.

2. The flexible display device according to claim 1,
wherein the water repellent layer is provided on an entire surface of the overcoat layer.

3. The flexible display device according to claim 1,
wherein the water repellent layer has a contact angle with water of 62 degrees or greater.

4. The flexible display device according to claim 3,
wherein the water repellent layer has a contact angle with water of 103 degrees or greater.

5. The flexible display device according to claim 1,
wherein the water repellent layer includes a moth-eye structure.

6. The flexible display device according to claim 1,
wherein the lyotropic liquid crystal is a lyotropic chromonic liquid crystal.

7. The flexible display device according to claim 1, further comprising:
a touch panel substrate,
wherein the touch panel substrate is provided between the sealing layer and the phase difference plate.

8. The flexible display device according to claim 1,
wherein a thickness of the linear polarizer is not less than 0.1 µm and not greater than 1 µm.

9. The flexible display device according to claim 1,
wherein a display region including the light-emitting element layer, a frame region surrounding the display region, and a terminal portion on one end of the frame region are provided on the second flexible substrate.

10. The flexible display device according to claim 9,
wherein the second flexible substrate includes four sides, and end portions of the second flexible substrate, the transistor layer, the first flexible substrate, the phase difference plate, the linear polarizer, the overcoat layer, and the water repellent layer are provided in alignment to each other at a side other than a side provided with the terminal portion among the four sides,
end portions of the first flexible substrate, the phase difference plate, the linear polarizer, the overcoat layer, and the water repellent layer are provided in alignment to each other between the terminal portion and the display region, and the terminal portion is provided on one end of the transistor layer exposed from the sealing layer, the first flexible substrate, the phase difference plate, the linear polarizer, the overcoat layer, and the water repellent layer.

11. A foldable display device comprising:
the flexible display device according to claim 9;
a first non-flexible support substrate supporting a first display region being part of the display region of the flexible display device; and
a second non-flexible support substrate supporting a second display region being another part of the display region of the flexible display device,
wherein a third display region being still another part of the display region of the flexible display device is between the first display region and the second display region, and overlaps with a gap between the first non-flexible support substrate and the second non-flexible support substrate, and
the flexible display device is bent in the third display region.

12. The foldable display device according to claim 11,
wherein the first non-flexible support substrate includes four sides, and end portions of the second flexible substrate, the transistor layer, the first flexible substrate, the phase difference plate, the linear polarizer, the overcoat layer, and the water repellent layer are provided in alignment to each other at a side or inside of the side other than a side in contact with the gap among the four sides,
the second non-flexible support substrate includes four sides, and end portions of the second flexible substrate, the transistor layer, the first flexible substrate, the phase difference plate, the linear polarizer, the overcoat layer, and the water repellent layer are provided in alignment to each other at two sides or inside of the two sides other than a side in contact with the gap and a side closer to the terminal portion among the four sides, and
end portions of the first flexible substrate, the phase difference plate, the linear polarizer, the overcoat layer, and the water repellent layer are provided in alignment to each other between the terminal portion and the display region at the side closer to the terminal portion among the four sides of the second non-flexible support substrate.

13. The foldable display device according to claim 12,
wherein the terminal portion is provided on a surface of the second non-flexible support substrate on a side opposite to a surface provided with the flexible display device.

14. A method for manufacturing a flexible display device, the method comprising:
forming a non-flexible display element substrate including forming a resin layer on a non-flexible first support substrate, forming a barrier layer on the resin layer, forming a transistor layer on the barrier layer, forming a light-emitting element layer on the transistor layer; and forming a sealing layer on the light-emitting element layer;

forming a circular polarizer including forming a first flexible substrate on a non-flexible second support substrate, forming a linear polarizer including a lyotropic liquid crystal on the first flexible substrate, forming an overcoat layer on the linear polarizer, forming a water repellent layer on the overcoat layer, and peeling off the non-flexible second support substrate from the first flexible substrate; and forming a flexible display element provided with a circular polarizer including attaching the circular polarizer to the sealing layer of the non-flexible display element substrate via an adhesive layer and peeling off the non-flexible first support substrate from the resin layer of the non-flexible display element substrate.

15. The method for manufacturing a flexible display device according to claim 14,
wherein the forming the flexible display element provided with the circular polarizer further includes attaching a second flexible substrate to a surface of the resin layer from which the non-flexible first support substrate is peeled off from, after the peeling off, the non-flexible first support substrate.

16. The method for manufacturing a flexible display device according to claim 15,
wherein the forming the circular polarizer further includes attaching a film to the water repellent layer, between the forming the water repellent layer and the peeling off the non-flexible second support substrate, and
the forming the flexible display element provided with the circular polarizer further includes peeling off the film, after the attaching the second flexible substrate.

17. The method for manufacturing a flexible display device according to claim 14,
wherein the non-flexible display element substrate is a display element assembly substrate including a plurality of display regions.

18. The method for manufacturing a flexible display device according to claim 14,
wherein the forming the non-flexible display element substrate further includes singulating the display element assembly substrate including the plurality of display regions into the plurality of individual display regions, and
the non-flexible display element substrate is a display element substrate including one display region.

19. The method for manufacturing a flexible display device according to claim 14,
wherein the forming the water repellent layer in the forming the circular polarizer further includes applying a water repellent material.

20. The method for manufacturing a flexible display device according to claim 14,
wherein in the forming the water repellent layer in the forming the circular polarizer, the water repellent layer having a film shape is attached to the overcoat layer.

* * * * *